United States Patent
Turner et al.

(10) Patent No.: US 10,727,858 B2
(45) Date of Patent: Jul. 28, 2020

(54) ERROR RESILIENCY FOR ENTROPY CODED AUDIO DATA

(71) Applicant: QUALCOMM Incorporated, San Diego, CA (US)

(72) Inventors: Richard Turner, Belfast (GB); Justin Hundt, Londonderry (GB); Gary Sands, Belfast (GB); Laurent Wojcieszak, Belfast (GB)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/412,048

(22) Filed: May 14, 2019

(65) Prior Publication Data

US 2019/0386674 A1   Dec. 19, 2019

Related U.S. Application Data

(60) Provisional application No. 62/686,597, filed on Jun. 18, 2018.

(51) Int. Cl.
| | |
|---|---|
| H03M 3/04 | (2006.01) |
| H03M 7/38 | (2006.01) |
| G10L 19/16 | (2013.01) |
| G10L 19/005 | (2013.01) |
| H04N 19/13 | (2014.01) |

(52) U.S. Cl.
CPC .......... *H03M 3/042* (2013.01); *G10L 19/005* (2013.01); *G10L 19/167* (2013.01); *H03M 7/3046* (2013.01); *H04N 19/13* (2014.11)

(58) Field of Classification Search
CPC ... H03M 3/042; H03M 7/3046; G10L 19/167; G10L 19/005; G10L 19/0017; H04N 19/13
USPC ................................. 341/51, 65, 67; 704/500
See application file for complete search history.

(56) References Cited

U.S. PATENT DOCUMENTS 7,392,195 B2 *  6/2008  Fejzo .................. G10L 19/0017
                                                   381/2
9,905,232 B2 *  2/2018  Hatanaka ............. G10L 19/008

OTHER PUBLICATIONS

Bluetooth SIG: "Bluetooth SIG Proprietary Bluetooth Core Specification v5.0", XP055499587, vol. 0, Dec. 6, 2016, 2822 Pages.
(Continued)

*Primary Examiner* — Khai M Nguyen
(74) *Attorney, Agent, or Firm* — Shumaker & Sieffert, P.A./ Qualcomm Imcorporated

(57) ABSTRACT

A source device comprising a memory and a processor may be configured to perform techniques described in this disclosure. The memory may store at least a portion of the audio data. The processor may obtain, from a compressed version of the audio data, a symbol, and obtain a plurality of intervals, each having a same bit length. The processor may obtain a portion of the symbol within the bit length and an excess portion of the symbol over the bit length, and specify, in a first interval, the portion of the symbol. The processor may also specify, in a second interval, the excess portion of the symbol, and apply, to the first interval and the second interval, error resiliency. The processor may specify, in a bitstream representative of the compressed version of the audio data, the first error resilient interval and the second error resilient interval.

30 Claims, 14 Drawing Sheets

(56) References Cited

OTHER PUBLICATIONS

Bluetooth SIG: "Bluetooth Specification, Advanced audio distribution profile specification, A2DP v 1.3.1", 2015, pp. 1-75.
Bluetooth SIG: "Generic Audio/Video Distribution Profile v 1.0", May 22, 2003, pp. 1-35.
Microchip Technology: "AN643 Adaptive Differential Pulse Code Modulation using PICmicro™ Microcontrollers", 1997, pp. 1-41.
Qualcomm Technologies: "CSR8645 BlueCore Audio Platform", 2 Pages.
Trainor D., "apt-X Lossless", White Paper, APT Licensing Ltd., 2009, 9 Pages.
Watts L., "Vector Quantization and scalar linear prediction for waveform coding of speech at 16 kb/s", Simon Fraser University, 1989, pp. 1-108.
U.S. Appl. No. 16/295,813, filed Mar. 7, 2019, entitled "Level Estimation for Processing Audio Data," by Turner et al.

\* cited by examiner

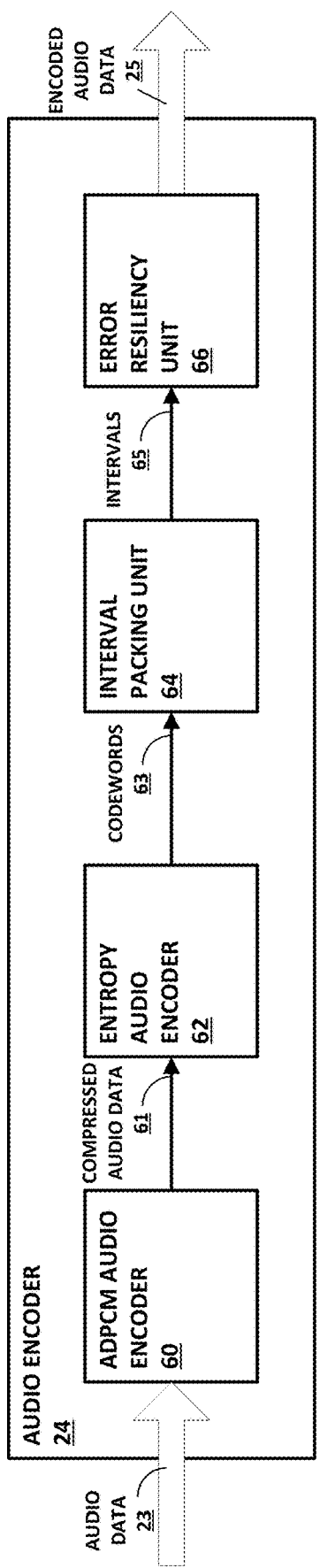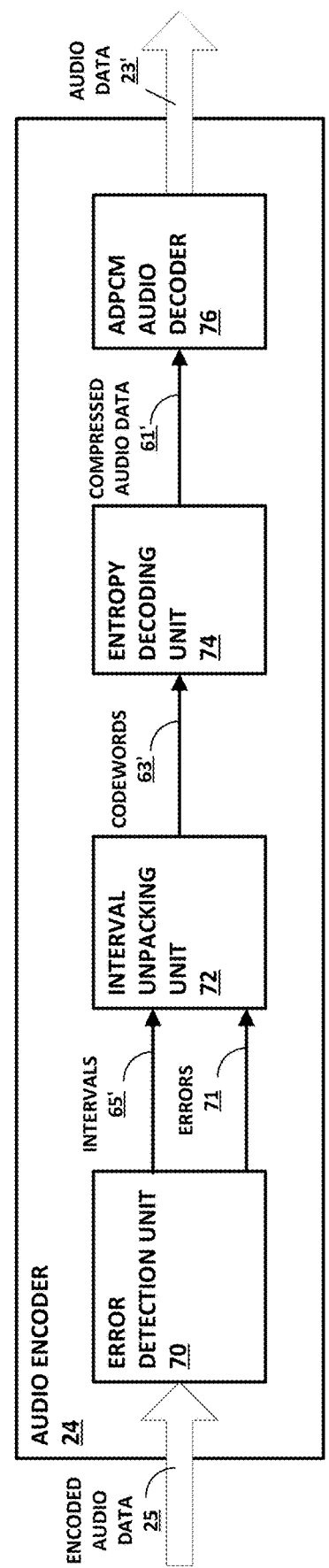
FIG. 2A
FIG. 2B

ERROR RESILIENCY FOR ENTROPY CODED AUDIO DATA

This application claims the benefit of U.S. Provisional Application No. 62/686,597, entitled "ERROR RESILIENCY FOR ENTROPY CODED AUDIO DATA," and filed 18 Jun. 2018, the entire contents of which are incorporated herein by reference.

TECHNICAL FIELD

This disclosure relates to processing audio data and, more specifically, error resiliency for coded audio data.

BACKGROUND

Wireless networks for short-range communication, which may be referred to as "personal area networks," are established to facilitate communication between a source device and a sink device. One example of a personal area network (PAN) protocol is Bluetooth®, which is often used to form a PAN for streaming audio data from the source device (e.g., a mobile phone) to the sink device (e.g., headphones or a speaker).

Streaming the audio data via the PAN may be vulnerable to errors due to local interference. In non-streaming contexts, the source device may implement a packet retransmission scheme by which to retransmit lost or corrupt (e.g., due to errors as a result of interference) packets. However, in the streaming context, which is often sent via a low latency wireless connection in certain contexts, like gaming, video teleconferences, audio teleconferences, etc., there often is insufficient time to retransmit lost or corrupt packets.

As such, the source device often implements an error resiliency scheme by which to identify bit errors in packets. However, error detection and correction often introduces signaling overhead that may reduce a quality of compressed audio data represented in a bitstream sent from the source device to the sink device. The reduced quality may occur upon playback as the signaling overhead for error detection and correction may consume bandwidth that would otherwise be dedicated to improving the resolution of the compressed audio data represented by the bitstream.

SUMMARY

In general, techniques are described by which to provide error resiliency for entropy coded audio data while potentially reducing signaling overhead associated with providing the error resiliency. The techniques may enable the audio encoder and the audio decoder to improve operation of the source device and the sink device themselves in terms of more efficient operation of the audio encoder and the audio decoder, which may reduce resource utilizing and power consumption. The techniques may allow the audio encoder and the audio decoder to better represent the audio data (compared to various other error resiliency schemes that utilize more complicated error correction schemes or regular interval reordering schemes) as signaling overhead is reduced relative to the various other error resiliency schemes. Reducing signaling overhead may result in better quality audio data than would otherwise be possible unless more processing cycles, memory, and memory bandwidth were consumed (thereby reducing power consumption). As such, the techniques may improve the operation of the audio encoder and the audio decoder themselves in contrast to merely implementing a known process using ordinary computing devices.

In one aspect, the techniques are directed to a source device configured to process audio data, the source device comprising: a memory configured to store at least a portion of the audio data; and one or more processors coupled to the memory, and configured to: obtain, from a compressed version of the audio data, a symbol of a plurality of symbols; obtain a plurality of intervals, each of the intervals having a same bit length; obtain a portion of the symbol within the bit length and an excess portion of the symbol over the bit length; specify, in a first interval of the plurality of intervals, the portion of the symbol; specify, in a second interval of the plurality of intervals, the excess portion of the symbol; apply, to the first interval and the second interval, error resiliency to obtain a first error resilient interval and a second error resilient interval; and specify, in a bitstream representative of the compressed version of the audio data, the first error resilient interval and the second error resilient interval.

In another aspect, the techniques are directed to a method of processing audio data, the method comprising: obtaining, from a compressed version of the audio data, a symbol of a plurality of symbols; obtaining a plurality of intervals, each of the intervals having a same bit length; obtaining a portion of the symbol within the bit length and an excess portion of the symbol over the bit length; specifying, in a first interval of the plurality of intervals, the portion of the symbol; specifying, in a second interval of the plurality of intervals, the excess portion of the symbol; applying, to the first interval and the second interval, error resiliency to obtain a first error resilient interval and a second error resilient interval; and specifying, in a bitstream representative of the compressed version of the audio data, the first error resilient interval and the second error resilient interval.

In another aspect, the techniques are directed to a source device configured to process audio data, the source device comprising: means for obtaining, from a compressed version of the audio data, a symbol of a plurality of symbols; means for obtaining a plurality of intervals, each of the intervals having a same bit length; means for obtaining a portion of the symbol within the bit length and an excess portion of the symbol over the bit length; means for specifying, in a first interval of the plurality of intervals, the portion of the symbol; means for specifying, in a second interval of the plurality of intervals, the excess portion of the symbol; means for applying, to the first interval and the second interval, error resiliency to obtain a first error resilient interval and a second error resilient interval; and means for specifying, in a bitstream representative of the compressed version of the audio data, the first error resilient interval and the second error resilient interval.

In another aspect, the techniques are directed to a computer-readable medium having stored thereon instructions that, when executed, cause one or more processors of a source device to: obtain, from a compressed version of audio data, a symbol of a plurality of symbols; obtain a plurality of intervals, each of the intervals having a same bit length; obtain a portion of the symbol within the bit length and an excess portion of the symbol over the bit length; specify, in a first interval of the plurality of intervals, the portion of the symbol; specify, in a second interval of the plurality of intervals, the excess portion of the symbol; apply, to the first interval and the second interval, error resiliency to obtain a first error resilient interval and a second error resilient interval; and specify, in a bitstream representative of the compressed version of the audio data, the first error resilient interval and the second error resilient interval.

In another aspect, the techniques are directed to a sink device configured to process a bitstream representative of a compressed version of audio data, the sink device comprising a memory configured to store at least a portion of the bitstream, and one or more processors coupled to the memory. The one or more processors may be configured to obtain, from the bitstream, a first error resilient interval and a second error resilient interval, each of the first error resilient interval and the second error resilient interval having a same bit length, and perform error detection with respect to the first error resilient interval and the second error resilient interval to detect a presence of one or more errors in one or more of the first error resilient interval and the second error resilient interval. The one or more processors may be further configured to responsive to detecting that the one or more errors were not present in the first error resilient interval and the second error resilient interval: obtain, from the first error resilient interval, a portion of a symbol within the bit length, the symbol indicative of the compressed version of the audio data, and obtain, from the second error resilient interval, an excess portion of the symbol over the bit length. The one or more processors may also be configured to decompress, based on the portion and the excess portion, the symbol to obtain a portion of the audio data.

In another aspect, the techniques are directed to a method of processing a bitstream representative of audio data, the method comprising obtaining, from the bitstream, a first error resilient interval and a second error resilient interval, each of the first error resilient interval and the second error resilient interval having a same bit length, and performing error detection with respect to the first error resilient interval and the second error resilient interval to detect a presence of one or more errors in one or more of the first error resilient interval and the second error resilient interval. The method also comprising responsive to detecting that the one or more errors were not present in the first error resilient interval and the second error resilient interval: obtaining, from the first error resilient interval, a portion of a symbol within the bit length, the symbol indicative of the compressed version of the audio data, and; obtaining, from the second error resilient interval, an excess portion of the symbol over the bit length. The method further comprising decompressing, based on the portion and the excess portion, the symbol to obtain a portion of the audio data.

In another aspect, the techniques are directed to a sink device configured to process a bitstream representative of audio data, the sink device comprising: means for obtaining, from the bitstream, a first error resilient interval and a second error resilient interval, each of the first error resilient interval and the second error resilient interval having a same bit length; means for performing error detection with respect to the first error resilient interval and the second error resilient interval to detect a presence of one or more errors in one or more of the first error resilient interval and the second error resilient interval; responsive to detecting that the one or more errors were not present in the first error resilient interval and the second error resilient interval: means for obtaining, from the first error resilient interval, a portion of a symbol within the bit length, the symbol indicative of the compressed version of the audio data, and; means for obtaining, from the second error resilient interval, an excess portion of the symbol over the bit length; and means for decompressing, based on the portion and the excess portion, the symbol to obtain a portion of the audio data.

In another aspect, the techniques are directed to a non-transitory computer-readable storage medium having stored thereon instructions that, when executed, cause one or more processors of a sink device to: obtain, from a bitstream representative of audio data, a first error resilient interval and a second error resilient interval, each of the first error resilient interval and the second error resilient interval having a same bit length; perform error detection with respect to the first error resilient interval and the second error resilient interval to detect a presence of one or more errors in one or more of the first error resilient interval and the second error resilient interval; responsive to detecting that the one or more errors were not present in the first error resilient interval and the second error resilient interval: obtain, from the first error resilient interval, a portion of a symbol within the bit length, the symbol indicative of the compressed version of the audio data, and; obtain, from the second error resilient interval, an excess portion of the symbol over the bit length; and decompress, based on the portion and the excess portion, the symbol to obtain a portion of the audio data.

The details of one or more aspects of the techniques are set forth in the accompanying drawings and the description below. Other features, objects, and advantages of these techniques will be apparent from the description and drawings, and from the claims.

BRIEF DESCRIPTION OF DRAWINGS

FIG. 2A is a block diagram illustrating an example of the audio encoder of FIG. 1 that may perform various aspects of the techniques described in this disclosure.

FIG. 2B is a block diagram illustrating an example of the audio decoder of FIG. 1 that may perform various aspects of the techniques described in this disclosure.

DETAILED DESCRIPTION

Figure 1:
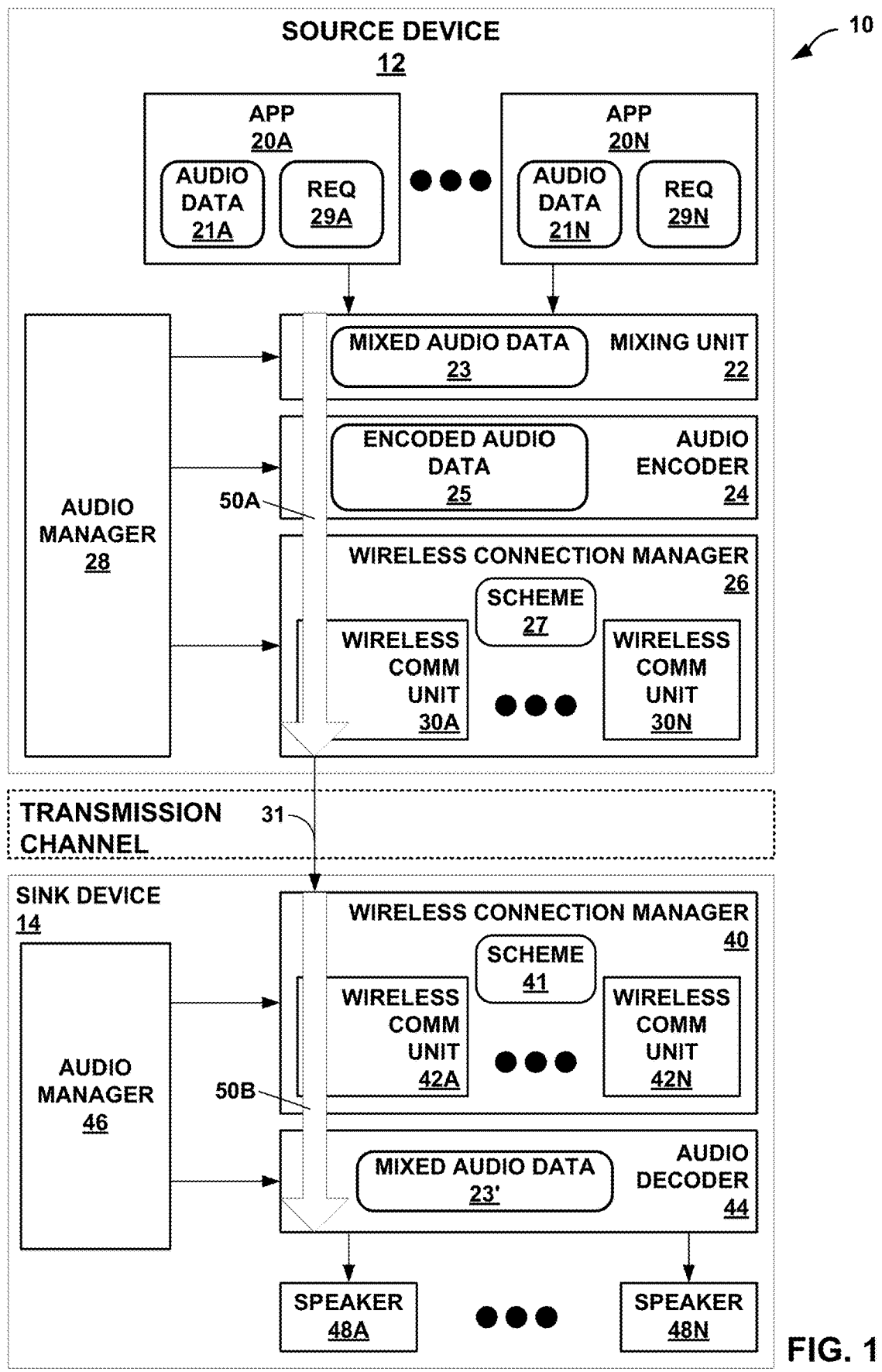
FIG. 1 is a block diagram illustrating a system that may perform various aspects of the techniques described in this disclosure.

FIG. 1 is a diagram illustrating a system 10 that may perform various aspects of the techniques described in this disclosure. As shown in the example of FIG. 1, the system 10 includes a source device 12 and a sink device 14. Although described with respect to the source device 12 and the sink device 14, the source device 12 may operate, in some instances, as the sink device, and the sink device 14 may, in these and other instances, operate as the source device. As such, the example of system 10 shown in FIG. 1 is merely one example illustrative of various aspects of the techniques described in this disclosure.

In any event, the source device 12 may represent any form of computing device capable of implementing the techniques described in this disclosure, including a handset (or cellular phone), a tablet computer, a so-called smart phone, a remotely piloted aircraft (such as a so-called "drone"), a robot, a desktop computer, a receiver (such as an audio/visual—AV—receiver), a set-top box, a television (including so-called "smart televisions"), a media player (such as s digital video disc player, a streaming media player, a Blue-Ray Disc™ player, etc.), or any other device capable of communicating audio data wirelessly to a sink device via a personal area network (PAN). For purposes of illustration, the source device 12 is assumed to represent a smart phone.

The sink device 14 may represent any form of computing device capable of implementing the techniques described in this disclosure, including a handset (or cellular phone), a tablet computer, a smart phone, a desktop computer, a wireless headset (which may include wireless headphones that include or exclude a microphone, and so-called smart wireless headphones that include additional functionality such as fitness monitoring, on-board music storage and/or playback, dedicated cellular capabilities, etc.), a wireless speaker (including a so-called "smart speaker"), a watch (including so-called "smart watches"), or any other device capable of reproducing a soundfield based on audio data communicated wirelessly via the PAN. Also for purposes of illustration, the sink device 14 is assumed to represent wireless headphones.

As shown in the example of FIG. 1, the source device 12 includes one or more applications ("apps") 20A-20N ("apps 20"), a mixing unit 22, an audio encoder 24, a wireless connection manager 26, and an audio manager 28. Although not shown in the example of FIG. 1, the source device 12 may include a number of other elements that support operation of apps 20, including an operating system, various hardware and/or software interfaces (such as user interfaces, including graphical user interfaces), one or more processors, memory, storage devices, and the like.

Each of the apps 20 represents software (such as a collection of instructions stored to a non-transitory computer readable media) that configures the source device 10 to provide some functionality when executed by the one or more processors of the source device 12. Apps 20 may, to provide a few examples, provide messaging functionality (such as access to emails, text messaging, and/or video messaging), voice calling functionality, video conferencing functionality, calendar functionality, audio streaming functionality, direction functionality, mapping functionality, gaming functionality. Apps 20 may be first-party applications designed and developed by the same company that designs and sells the operating system executed by the source device 20 (and often pre-installed on the source device 20) or third-party applications accessible via a so-called "app store" or possibly pre-installed on the source device 20. Each of the apps 20, when executed, may output audio data 21A-21N ("audio data 21"), respectively.

The mixing unit 22 represent a unit configured to mix one or more of audio data 21A-21N ("audio data 21") output by the apps 20 (and other audio data output by the operating system—such as alerts or other tones, including keyboard press tones, ringtones, etc.) to generate mixed audio data 23. Audio mixing may refer to a process whereby multiple sounds (as set forth in the audio data 21) are combined into one or more channels. During mixing, the mixing unit 22 may also manipulate and/or enhance volume levels (which may also be referred to as "gain levels"), frequency content, panoramic position of the audio data 21. In the context of streaming the audio data 21 over a wireless PAN session, the mixing unit 22 may output the mixed audio data 23 to the audio encoder 24.

The audio encoder 24 may represent a unit configured to encode the mixed audio data 23 and thereby obtain encoded audio data 25. Referring for purposes of illustration to one example of the PAN protocols, Bluetooth® provides for a number of different types of audio codecs (which is a word resulting from combining the words "encoding" and "decoding"), and is extensible to include vendor specific audio codecs. The Advanced Audio Distribution Profile (A2DP) of Bluetooth® indicates that support for A2DP requires supporting a subband codec specified in A2DP. A2DP also supports codecs set forth in MPEG-1 Part 3 (MP2), MPEG-2 Part 3 (MP3), MPEG-2 Part 7 (advanced audio coding—AAC), MPEG-4 Part 3 (high efficiency-AAC—HE-AAC), and Adaptive Transform Acoustic Coding (ATRAC). Furthermore, as noted above, A2DP of Bluetooth® supports vendor specific codecs, such as aptX™ and various other versions of aptX (e.g., enhanced aptX—E-aptX, aptX live, and aptX high definition—aptX-HD).

AptX may refer to an audio encoding and decoding (which may be referred to generally as a "codec") scheme by which to compress and decompress audio data, and may therefore be referred to as an "aptX audio codec." AptX may improve the functionality of the source and sink devices themselves as compression results in data structures that organize data in a manner that reduces bandwidth (including over internal busses and memory pathways) and/or storage consumption. The techniques described in this disclosure may further improve bandwidth and/or storage consumption, thereby improving operation of the devices themselves in contrast to merely implementing a known process using devices.

The audio encoder 24 may operate consistent with one or more of any of the above listed audio codecs, as well as, audio codecs not listed above, but that operate to encode the mixed audio data 23 to obtain the encoded audio data 25. The audio encoder 24 may output the encoded audio data 25 to one of the wireless communication units 30 (e.g., the wireless communication unit 30A) managed by the wireless connection manager 26.

The wireless connection manager 26 may represent a unit configured to allocate bandwidth within certain frequencies of the available spectrum to the different ones of the wireless communication units 30. For example, the Bluetooth® communication protocols operate over within the 2.4 GHz range of the spectrum, which overlaps with the range of the spectrum used by various WLAN communication protocols. The wireless connection manager 26 may allocate some portion of the bandwidth during a given time to the Bluetooth® protocol and different portions of the bandwidth during a different time to the overlapping WLAN protocols. The allocation of bandwidth and other is defined by a scheme 27. The wireless connection manager 26 may expose various application programmer interfaces (APIs) by which to adjust the allocation of bandwidth and other aspects of the communication protocols so as to achieve a specified quality of service (QoS). That is, the wireless connection manager 26 may provide the API to adjust the scheme 27 by which to control operation of the wireless communication units 30 to achieve the specified QoS.

In other words, the wireless connection manager 26 may manage coexistence of multiple wireless communication units 30 that operate within the same spectrum, such as certain WLAN communication protocols and some PAN protocols as discussed above. The wireless connection manager 26 may include a coexistence scheme 27 (shown in FIG. 1 as "scheme 27") that indicates when (e.g., an interval) and how many packets each of the wireless communication units 30 may send, the size of the packets sent, and the like.

The wireless communication units 30 may each represent a wireless communication unit 30 that operates in accordance with one or more communication protocols to communicate encoded audio data 25 via a transmission channel to the sink device 14. In the example of FIG. 1, the wireless communication unit 30A is assumed for purposes of illustration to operate in accordance with the Bluetooth® suite of communication protocols. It is further assumed that the wireless communication unit 30A operates in accordance with A2DP to establish a PAN link (over the transmission channel) to allow for delivery of the encoded audio data 25 from the source device 12 to the sink device 14.

More information concerning the Bluetooth® suite of communication protocols can be found in a document entitled "Bluetooth Core Specification v 5.0," published Dec. 6, 2016. The foregoing Bluetooth Core Specification provides further details regarding a so-called Bluetooth Low Energy and Classic Bluetooth, where the Bluetooth Low Energy (BLE) operates using less energy than Classic Bluetooth. Reference to Bluetooth® (which may also be referred to as a "Bluetooth® wireless communication protocol") may refer to one of BLE and Classic Bluetooth, or both BLE and Classic Bluetooth. More information concerning A2DP can be found in a document entitled "Advanced Audio Distribution Profile Specification," version 1.3.1, published on Jul. 14, 2015.

The wireless communication unit 30A may output the encoded audio data 25 as a bitstream 31 to the sink device 14 via a transmission channel, which may be a wired or wireless channel, a data storage device, or the like. While shown in FIG. 1 as being directly transmitted to the sink device 14, the source device 12 may output the bitstream 31 to an intermediate device positioned between the source device 12 and the sink device 14. The intermediate device may store the bitstream 31 for later delivery to the sink device 14, which may request the bitstream 31. The intermediate device may comprise a file server, a web server, a desktop computer, a laptop computer, a tablet computer, a mobile phone, a smart phone, or any other device capable of storing the bitstream 31 for later retrieval by an audio decoder. This intermediate device may reside in a content delivery network capable of streaming the bitstream 31 (and possibly in conjunction with transmitting a corresponding video data bitstream) to subscribers, such as the sink device 14, requesting the bitstream 31.

Alternatively, the source device 12 may store the bitstream 31 to a storage medium, such as a compact disc, a digital video disc, a high definition video disc or other storage media, most of which are capable of being read by a computer and therefore may be referred to as computer-readable storage media or non-transitory computer-readable storage media. In this context, the transmission channel may refer to those channels by which content stored to these mediums are transmitted (and may include retail stores and other store-based delivery mechanism). In any event, the techniques of this disclosure should not therefore be limited in this respect to the example of FIG. 1.

As further shown in the example of FIG. 1, the sink device 14 includes a wireless connection manager 40 that manages one or more of wireless communication units 42A-42N ("wireless communication units 42") according to a scheme 41, an audio decoder 44, and one or more speakers 48A-48N ("speakers 48"). The wireless connection manager 40 may operate in a manner similar to that described above with respect to the wireless connection manager 26, exposing an API to adjust scheme 41 by which the wireless communication units 42 operate to achieve a specified QoS.

The wireless communication units 42 may be similar in operation to the wireless communication units 30, except that the wireless communication units 42 operate reciprocally to the wireless communication units 30 to decapsulate the encoded audio data 25. One of the wireless communication units 42 (e.g., the wireless communication unit 42A) is assumed to operate in accordance with the Bluetooth® suite of communication protocols and reciprocal to the wireless communication protocol 28A. The wireless communication unit 42A may output the encoded audio data 25 to the audio decoder 44.

The audio decoder 44 may operate in a manner that is reciprocal to the audio decoder 24. The audio decoder 44 may operate consistent with one or more of any of the above listed audio codecs, as well as, audio codecs not listed above, but that operate to decode the encoded audio data 25 to obtain mixed audio data 23'. The prime designation with respect to "mixed audio data 23" denotes that there may be some loss due to quantization or other lossy operations that occur during encoding by the audio encoder 24. The audio decoder 44 may output the mixed audio data 23' to one or more of the speakers 48.

Each of the speakers 48 may represent a transducer configured to reproduce a soundfield from the mixed audio data 23'. The transducer may be integrated within the sink device 14 as shown in the example of FIG. 1, or may be communicatively coupled to the sink device 14 (via a wire or wirelessly). The speakers 48 may represent any form of speaker, such as a loudspeaker, a headphone speaker, or a speaker in an earbud. Furthermore, although described with respect to a transducer, the speakers 48 may represent other forms of speakers, such as the "speakers" used in bone conducting headphones that send vibrations to the upper jaw, which induces sound in the human aural system.

As noted above, the apps 20 may output audio data 21 to the mixing unit 22. Prior to outputting the audio data 21, the apps 20 may interface with the operating system to initialize an audio processing path for output via integrated speakers (not shown in the example of FIG. 1) or a physical connection (such as a mini-stereo audio jack, which is also known as 3.5 millimeter—mm—minijack). As such, the audio processing path may be referred to as a wired audio processing path considering that the integrated speaker is connected by a wired connection similar to that provided by the physical connection via the mini-stereo audio jack. The wired audio processing path may represent hardware or a combination of hardware and software that processes the audio data 21 to achieve a target quality of service (QoS).

To illustrate, one of the apps 20 (which is assumed to be the app 20A for purposes of illustration) may issue, when initializing or reinitializing the wired audio processing path, one or more request 29A for a particular QoS for the audio data 21A output by the app 20A. The request 29A may specify, as a couple of examples, a high latency (that results in high quality) wired audio processing path, a low latency (that may result in lower quality) wired audio processing path, or some intermediate latency wired audio processing path. The high latency wired audio processing path may also be referred to as a high quality wired audio processing path, while the low latency wired audio processing path may also be referred to as a low quality wired audio processing path.

The audio manager 28 may represent a unit configured to manage processing of the audio data 21. That is, the audio manager 28 may configure the wired audio processing path within source device 12 in an attempt to achieve the requested target QoS. The audio manager 28 may adjust an amount of memory dedicated to buffers along the wired audio processing path for the audio data 21, shared resource priorities assigned to the audio data 21 that control priority when processed using shared resources (such as processing cycles of a central processing unit—CPU—or processing by a digital signal processor—DSP—to provide some examples), and/or interrupt priorities assigned to the audio data 21.

Configuring the wired audio processing path to suit the latency requirements of the app 20A may allow for more immersive experiences. For example, a high latency wired audio processing path may result in higher quality audio playback that allows for better spatial resolution that places a listener more firmly (in a auditory manner) in the soundfield, thereby increasing immersion. A low latency wired audio processing path may result in more responsive audio playback that allows game and operating system sound effects to arrive in real-time or near-real-time to match on-screen graphics, allow for accurate soundfield reproduction in immersive virtual reality, augmented reality, and/or mixed-reality contexts and the like, accurate responsiveness for digital music creation contexts, and/or accurate responsiveness for playback during manipulation of virtual musical instruments.

As noted above, the source device 12 may include the audio encoder 24 by which to compress the audio data 23 prior to transmission as a bitstream 31 via the PAN. Streaming the audio data via the PAN may be vulnerable to errors due to local interference. In non-streaming contexts, the source device 12 may implement a packet retransmission scheme by which to retransmit lost or corrupt (e.g., due to errors as a result of interference) packets of the bitstream 31. However, in the streaming context, which is often sent via a low latency wireless connection in certain contexts, like gaming, video teleconferences, audio teleconferences, etc. as noted above, there often is insufficient time to retransmit lost or corrupt packets.

As such, the source device 12 may implement an error resiliency scheme by which to identify bit errors in packets of the bitstream 31. However, error resiliency often introduces signaling overhead that may reduce a quality of compressed audio data represented in the bitstream 31 sent from the source device 12 to the sink device 14. The reduced quality may occur upon playback as the signaling overhead for error resiliency may consume bandwidth that would otherwise be dedicated to improving the resolution of the compressed audio data represented by the bitstream 31.

In accordance with various aspects of the techniques described in this disclosure, the audio encoder 24 may provide error resiliency (via redundancy such as majority voting in the bitstream 21) for entropy coded audio data while potentially reducing signaling overhead associated with providing the error resiliency. The reduction in signaling overhead may allow the audio encoder 24 to potentially retain some amount of the increased resolution of the audio data 23 that would otherwise be lost when performing other error resiliency schemes.

The audio decoder 44 may perform, based on the error resiliency embedded in the bitstream 31, error detection in accordance with various aspects of the techniques described in this disclosure. Given that the error resiliency reduces signaling overhead as described in more detail below, the audio decoder 44 may decompress the bitstream to obtain audio data 23' having a higher resolution compared to bitstreams that provide error resiliency via other error resiliency schemes.

In operation, the audio encoder 24 may provide error resiliency with reduced signaling overhead by, at least in part, implementing a symbol packing scheme that allows for packing of symbols to intervals having a same bit length. The audio encoder 24 may, to obtain the symbols, compress the audio data 23 according to one or more of the audio codecs noted above. For purposes of illustration, it is assumed that the audio encoder 24 performs compression in accordance with aptX, which may, in one example, involve application of adaptive differential pulse code modulation (ADPCM) encoding/decoding.

After performing ADPCM encoding with respect to the audio data 23 to obtain ADPCM compressed audio data, the audio encoder 24 may perform statistical lossless encoding (which may be referred to as "entropy encoding" or "entropy coding") with respect to the ADPCM compressed audio data to obtain one or more codewords. An example of entropy coding is Huffman coding, which may result in Huffman codewords. The audio encoder 24 may obtain, based on the one or more codewords, the symbols.

While entropy encoding may provide additional compression to ADPCM codecs, such entropy encoding may sacrifice error resiliency. That is, prefix-code entropy encoding, like Huffman coding, may be intolerant of bit errors as a single error (e.g., flipping a bit from a zero to a one or a one to a zero) may invalidate the prefix property of prefix-code entropy encoding in which each codeword is restricted from being a prefix of any other codeword, thereby preventing correct parsing of the errored codeword, and in this instance, symbol.

To reduce the impact of this deficiency, the audio encoder 24 may introduce two processes. First, the audio encoder 24 may specify (or, in other words, "pack") the symbols into regular intervals. The intervals are "regular" in the sense that each interval is of a uniform (or, in other words, same) bit length. Second, the audio encoder 24 may provide error resiliency via various error resiliency schemes, such as parity bit schemes, majority voting schemes, check digit scheme, etc., on a bit-by-bit basis, codeword-by-codeword basis, an interval-by-interval basis, or a packet-by-packet basis. The interval may limit the extent an error may corrupt the underlying audio data to a single interval, while the error resiliency may enable detection (and possibly correction in certain high bandwidth or high latency contexts).

Unlike other codecs that utilize entropy coding in conjunction with regular intervals, the audio encoder 24 does not set the bit length of the regular intervals to be the same as or greater than a maximum size of a symbol so as to ensure each symbol is capable of being specified within a single interval. In codecs that utilize entropy coding in conjunction with intervals that can accommodate symbols of a maximum size, there may be wasted space in intervals having symbols that are not of the maximum size. To more fully utilize the intervals (e.g., compared to other codecs having intervals of maximum symbol size), the audio encoder 24 may split symbols that exceed the bit length of a single interval across multiple intervals.

When specifying the symbol in the interval, the audio encoder 24 may compare the symbol to the bit length of the first interval to determine whether the symbol exceeds the bit length of the interval. Assuming that the symbol exceeds the bit length of the first interval, the audio encoder 24 may obtain a portion of the symbol within the bit length and an excess portion of the symbol over the bit length. The audio encoder 24 may specify, in a first interval of the plurality of intervals, the portion of the symbol. The audio encoder 24 may also specify, in a second interval of the plurality of intervals, the excess portion of the symbol.

Next, the audio encoder 24 may apply, to the first interval and the second interval, error resiliency to obtain a first error resilient interval and a second error resilient interval. As noted above, the audio encoder 24 may provide error resiliency via various error resiliency schemes, such as parity bit schemes, majority voting schemes, check digit scheme, etc., on a bit-by-bit basis, codeword-by-codeword basis, an interval-by-interval basis, or a packet-by-packet basis. The audio encoder 24 may specify the first error resilient interval and the second error resilient interval in the encoded audio data 25 (which may also be referred to as the "bitstream 25").

As noted above, the audio decoder 44 may be configured to perform operations reciprocal to those described above with respect to the audio encoder 24. As such, the audio decoder 44 may obtain, from the bitstream 25, a first error resilient interval and a second error resilient interval, each of which may, as noted above, have the same bit length.

The audio decoder 44 may next perform error detection with respect to the first error resilient interval and the second error resilient interval to detect a presence of one or more errors in one or more of the first error resilient interval and the second error resilient interval. Responsive to detecting that the one or more errors were not present in the first error resilient interval and the second error resilient interval, the audio decoder 44 may obtain, from the first error resilient interval, the portion of the symbol within the bit length. Also, responsive to detecting that the one or more errors were not present in the first error resilient interval and the second error resilient interval, the audio decoder 44 may obtain, from the second error resilient interval, the excess portion of the symbol over the bit length, and decompress, based on the portion and the excess portion, the symbol to obtain a portion of the audio data 23'.

In this respect, the techniques may enable the audio encoder 24 and the audio decoder 44 to improve operation of the source device 12 and/or audio encoder 24 and the sink device 14 and/or audio decoder 44 themselves in terms of more efficient operation of the audio encoder and the audio decoder, which may reduce resource utilizing and power consumption. The techniques may allow the audio encoder 24 and the audio decoder 44 to better represent the audio data 23 (compared to various other error resiliency schemes that utilize more complicated error correction schemes or regular interval reordering schemes) as signaling overhead is potentially reduced relative to the various other error resiliency schemes. Reducing signaling overhead may result in better quality audio data than would otherwise be possible unless more processing cycles, memory, and memory bandwidth were consumed (thereby reducing power consumption). As such, the techniques may improve the operation of the audio encoder 24 and the audio decoder 44 themselves in contrast to merely implementing a known process using ordinary computing devices.

FIG. 2A is a block diagram illustrating an example of the audio encoder of FIG. 1 that may perform various aspects of the techniques described in this disclosure. As shown in the example of FIG. 2A, the audio encoder 24 may include an ADPCM audio encoder 60, an entropy audio encoder 62, an interval packing unit 64, and an error resiliency unit 66.

The ADPCM audio encoder 60 may represent a unit configured to perform ADPCM audio encoding with respect to the audio data 23 to obtain compressed audio data 61. The ADPCM audio encoder 60 is described below in more detail with respect to the example of FIG. 3A. The ADPCM audio encoder 60 may output the compressed audio data 61 to entropy audio encoder 62, which may include one or more compressed portions. As described below, the compressed portions may include compressed subbands. As such, the compressed audio data 61 may also be referred to as compressed subbands 61 or bitstream 61.

The entropy audio encoder 62 may represent a unit configured to perform statistical lossless coding with respect to the compressed audio data 61 to obtain codewords 63. In some instances, the entropy audio encoder 62 may perform prefix-code entropy coding, such as Huffman coding, with respect to the compressed audio data 61 to obtain the codewords 63. The entropy audio encoder 62 may perform entropy coding with respect to each of the compressed subbands 61, generating a sequence (e.g., time-ordered sequence) of codewords 63 for each of the compressed subbands 63. The entropy audio encoder 62 may output the codewords 63 to interval packing unit 64.

The interval packing unit 64 may represent a unit configured to specify (or, in other words, pack) the codewords 63 into a number of uniform intervals. The interval packing unit 64 may obtain, based on the codewords 63, one or more symbols. In order to obtain the symbols, the interval packing unit 64 may obtain, from the compressed audio data 61, an ordering of each of the compressed subbands 63 relative to the remaining compressed subbands 63. The ADPCM audio encoder 60 may specify the ordering of each of the compressed subbands 63 relative to the remaining compressed subbands 63 via various syntax elements either explicitly or implicitly (e.g., in the form of a bit allocation identifying a number of bits allocated to each of the subbands). Based on the ordering and the codewords 63, the interval packing unit 64 may obtain the symbols.

For example, the interval packing unit 64 may determine, based on the ordering, that a subset of the subbands are more important (in terms of representing the soundfield indicated by the audio data 23) than the remaining subbands. The term "subset" should be understood to refer to one or more items contrary to the mathematical definition in which the term "subset" may refer to zero or more items unless explicitly indicated otherwise. In any event, the interval packing unit 64 may determine, in this example, that three of the subbands are more important in that, as an example, a higher number of bits were allocated per sample than the remaining subbands.

The interval packing unit 64 may obtain a sequential ordering of the codewords 63 corresponding to the three subbands, and then formulate a symbol as a tuple of a first codeword from the first of the three subbands, a second codeword of a second of the three subbands, and a third codeword from a third of the three subbands. The interval packing unit 64 may then iterate to the next set of three codewords from the respective three subbands to obtain a sequentially successive symbol. The interval packing unit 64 may continue in this manner to obtain symbols. In this respect, each of the symbols comprises a codeword from the one or more codewords 63 of two or more of the entropy coded versions of the plurality of filtered portions (i.e., the codewords 63 shown in the example of FIG. 2A).

The interval packing unit 64 may also identify the subset of subbands (in the form of the corresponding ones of the codewords 63) as the subset to which error resiliency is to be applied. That is, the same subset from which the interval packing unit 64 may obtain the symbols may also represent a subset of the plurality of portions to which the error resiliency is to be applied. In this respect, the interval packing unit 64 may identify those of the intervals to which error resiliency is to be applied.

The interval packing unit 64 may also obtain symbols based on codewords 63 corresponding to subbands that are relatively less important (as indicated, for example, by having less bits allocated to the subbands per the bit allocation specified in the compressed audio data 61). The interval packing unit 64 may identify these symbols as corresponding to subbands to which error resiliency is not to be applied. The interval packing unit 64 may, as discussed below in more detail, specify these symbols into any space remaining within the intervals after specifying the symbols to which error resiliency is to be applied. More information regarding how the symbols are packed into the intervals is described with respect to the example of FIGS. 4A-4F.

Figure 4A:
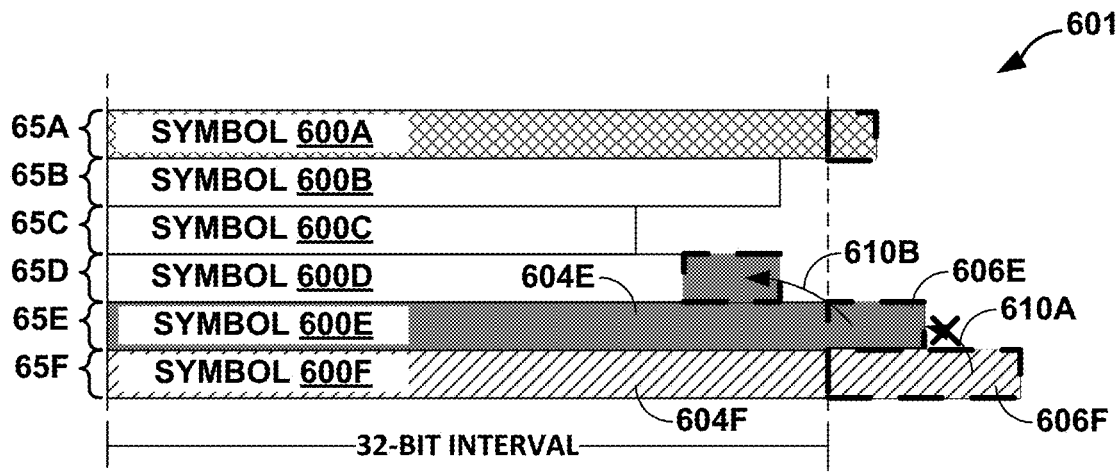
FIGS. 4A-4E are diagrams illustrating example operation of the interval packing unit shown in FIG. 2A in performing various aspects of the techniques described in this disclosure.

FIGS. 4A-4E are diagrams illustrating example operation of the interval packing unit shown in FIG. 2A in performing various aspects of the techniques described in this disclosure. The interval packing unit 64 may first obtain, as shown in the example of FIG. 4A, symbols 600A-600F ("symbols 600"). The interval packing unit 64 may next obtain intervals 65A-65F ("intervals 65"), which may form a packet 601 of the bitstream 25. Each of the intervals 65 have a same bit length of 32 bits. Although described with respect to a bit length of 32 bits, the techniques may be performed with respect to any bit length, and should not be limited to the example bit length of 32 bits. Furthermore, the interval may be regular (or, in other words, uniform), non-regular (e.g., vary between packets), and/or defined in packets/stream or outside of the packets/stream as side information.

After obtaining the symbols 600 and the intervals 65, the interval packing unit 64 may systematically (or, in other words, algorithmically) begin packing the symbols 600 into the intervals 65. As shown in FIG. 4A, the interval packing unit 64 may arrange the intervals 65 according to a stack structure, arranging each of the intervals to form a stack data structure such that the interval 65E is directly above the interval 65F, the interval 65D is directly above the interval 65E, the interval 65C is directly above the interval 65D, the interval 65B is directly above the interval 65C, and the interval 65A is directly above the interval 65B. As such, the intervals 65 may be referred to as an interval stack 65.

Next, the interval packing unit 64 may push each of the symbols 600 onto the interval stack 65, starting with symbol 600F, and proceeding to push each of symbols 600E-600A one after another onto the stack. The example of FIG. 4A shows the result of pushing the symbols 600 onto the interval stack 65, with the symbol 600F stored to the interval 65F, the symbol 600E stored to the interval 65E, the symbol 600D stored to the interval 65D, the symbol 600C stored to the interval 65C, the symbol 600B stored to the interval 65B, and the symbol 600A stored to the interval 65A.

As further shown in the example of FIG. 4A, the symbol 600F exceeds the 32-bit length of the interval 600F, the symbol 600E exceed the 32-bit length of the interval 600E, and the symbol 600A exceed the bit length of the interval 65A. The interval packing unit 64 may begin from the bottom of the interval stack 65, systematically comparing each of the symbols 600F-600A (in that order) to the 32-bit length of each of the intervals 65. As such, the interval packing unit 64 may first determine that the symbol 600F exceeds the 32-bit length.

Responsive to determining that the symbol 600F exceeds the 32-bit length, the interval packing unit 64 may obtain a portion 604F of the symbol 600F that is within the 32-bit length, and an excess portion 606F of the symbol 600F that exceeds the 32-bit length. The interval packing unit 64 may attempt to relocate (or, in other words, specify) the excess portion 606F to the interval 65E directly above the interval 65F (as denoted by arrow 610A). However, the interval packing unit 64 may determine that the interval 65E does not have any available space, considering that the symbol 600E exceeds the 32-bit length. The interval packing unit 64 may then halt processing of the symbol 600F (as denoted by the "X" over the arrow 610A), and proceed to processing of the interval 600E directly above the interval 65F.

The interval packing unit 64 may begin processing of the interval 65E by comparing the symbol 600E to the 32-bit length to determine that the symbol 65E exceeds the 32-bit length. Responsive to determining that the interval 65E exceeds the 32-bit length, the interval packing unit 64 may obtain a portion 604E within the 32-bit length, and an excess portion 606E that exceeds the 32-bit length. The interval packing unit 64 may next attempt to relocate the excess portion 606E to the interval 65D directly above the interval 65E in the interval stack 65.

To relocate the excess portion 606E, the interval packing unit 64 may first determine whether the symbol 600D exceeds the 32-bit length. As shown in the example of FIG. 4A, the symbol 600D does not exceed the 32-bit length. The interval packing unit 64, responsive to determining that the symbol 600D does not exceed the 32-bit length, reallocate at least some of the excess portion 606E to the interval 65D. In the example of FIG. 4A, the interval packing unit 64 may relocate all of excess portion 606E to the interval 65D (as denoted by arrow 610B).

Figure 4B:
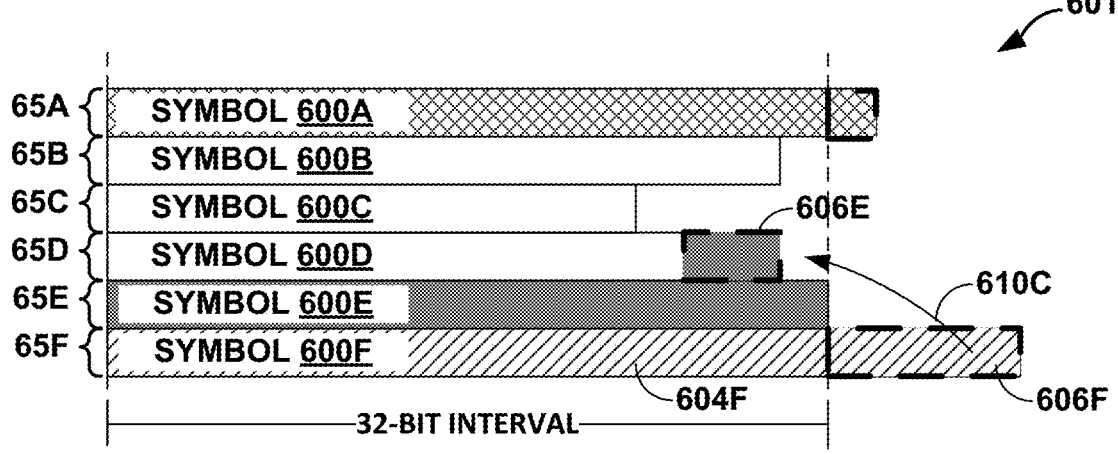

Referring next to the example of FIG. 4B, the interval packing unit 64 may, after relocating excess portion 606E, return to symbol 600F, and attempt to relocate excess portion 606F. In this respect, the interval packing unit 64 may be configured to execute a recursive algorithm in which the algorithm calls itself in order to pack the symbol 600E, saving any state produced when packing the symbol 600F, and returning to the first invocation of the algorithm to pack, based on the saved state, the symbol 600F. In any event, the interval packing unit 64 may, based on the saved state, determine whether the next interval, i.e., the interval 600D in this example, has any available space to store excess portion 606F.

In this example, the interval packing unit 64 may determine that the symbol 606D plus excess portion 606E does not exceed the 32-bit length and that there is available space in the interval 65D. As such, the interval may relocated the excess portion 606F to the interval 65D (as denoted by arrow 610C), with the result of the relocation shown in the example of FIG. 4C.

Figure 4C:
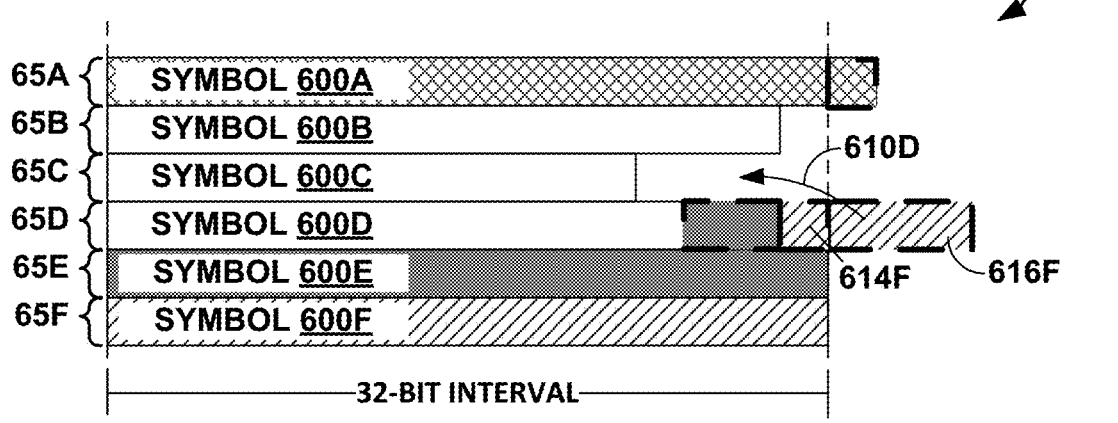

Referring to the example of FIG. 4C, the interval packing unit 64 has relocated the excess portion 606F. The interval packing unit 64 may, after relocating the excess portion 606F, determine whether the symbol 600D plus the excess portion 606E and the excess portion 606F exceeds the 32-bit length. In the example of FIG. 4C, the interval packing unit 64 may determine that the symbol 600D plus the excess portion 606E and the excess portion 606F exceeds the 32-bit length.

Responsive to determining that the symbol 600D plus the excess portion 606E and the excess portion 606F exceeds the 32-bit length, the interval packing unit 64 may obtain, a sub-portion 614F of the excess portion 606F within the 32-bit length and an excess sub-portion 616F that exceeds the 32-bit length. The interval packing unit 64 may attempt to relocate the excess sub-portion 616F to the interval 65C directly above the current interval 606D.

To relocate the excess sub-portion 616F, the interval packing unit 64 may first determine whether the symbol 600C stored to the interval 600C exceeds the 32-bit length. As shown in the example of FIG. 4C, the symbol 600C does not exceed the 32-bit length. The interval packing unit 64, responsive to determining that the symbol 600C does not exceed the 32-bit length, reallocate at least some of the excess sub-portion 616F to the interval 65C. In the example of FIG. 4C, the interval packing unit 64 may relocate all of excess sub-portion 616F to the interval 65C (as denoted by arrow 610D), the result of which is shown in the example of FIG. 4D.

Figure 4D:
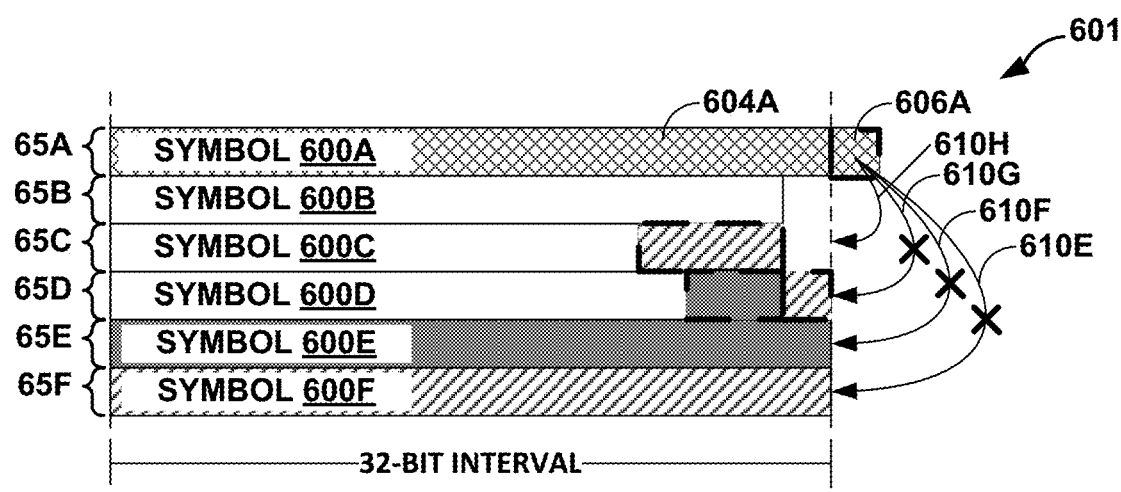

Referring next to the example of FIG. 4D, the interval packing unit 64 has relocated the excess sub-portion 616F to the interval 65C. The interval packing unit 64 may, after relocating the excess sub-portion 616F, determine whether the symbol 600C plus the excess sub-portion 616F exceeds the 32-bit length. In the example of FIG. 4D, the interval packing unit 64 may determine that the symbol 600C plus the excess sub-portion 616F does not exceed the 32-bit length. As such, the interval packing unit 64 processes the interval 65B directly above the interval 65C in the interval stack 65.

In processing the interval 65B, the interval packing unit 64 may first determine whether the symbol 600B exceeds the 32-bit length of the interval 65B. Responsive to determining that the symbol 600B does not exceed the 32-bit length, the interval packing unit 64 may proceed to process the interval 65A directly above the interval 65B in the interval stack 65.

In processing the interval 65A, the interval packing unit 64 may first determine whether the symbol 600A exceeds the 32-bit length of the interval 65A. Responsive to determining that the symbol 600A exceeds the 32-bit length, the interval packing unit 64 may obtain a portion 604A of the symbol 600A that is within the 32-bit length and an excess portion 606A that exceeds the 32-bit length. The interval packing unit 64 may attempt to relocate the excess portion 606A by looping around the stack 65 (e.g., starting at the interval 65F at the bottom of the interval stack 65), and iteratively moving up from the bottom of the interval stack 65 from interval 65E-65B responsive to determining that the interval 65F does not have any available space (as denoted by the "X" on an arrow 610E).

The interval packing unit 64 may sequentially determine that the intervals 65E, and then the interval 65D also do not have any available space (as denoted by the "X" on an arrow 610F and on an arrow 610G, respectively). The interval packing unit 64 may next determine that the interval 65C has available space and relocate at least some of the excess portion 606A to the interval 65C (as denoted by an arrow 610H), the result of which is shown in the example of FIG. 4E.

Figure 4E:
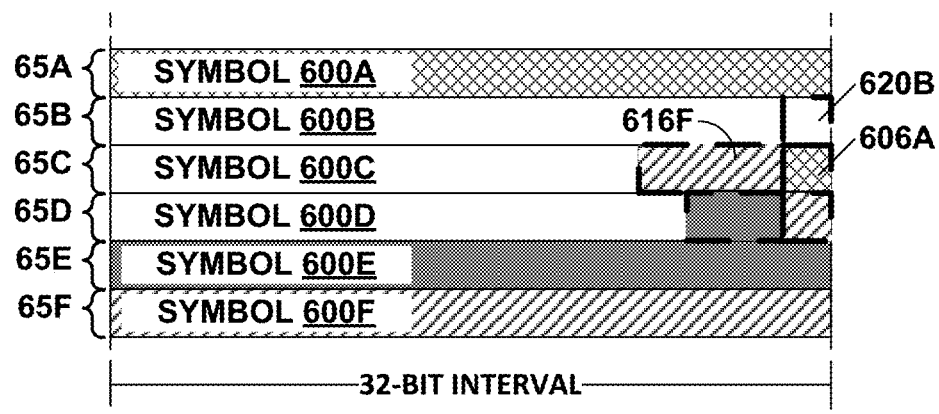

In the example of FIG. 4E, the interval packing unit 64 has relocated the excess portion 606A to the interval 65C. The interval packing unit 64 may, after relocating the excess portion 606A, determine whether the symbol 600C plus the excess sub-portion 616F and the excess portion 606A exceeds the 32-bit length. In the example of FIG. 4E, the interval packing unit 64 may determine that the symbol 600C plus the excess sub-portion 616F and the excess portion 606A does not exceed the 32-bit length.

Responsive to determining that the symbol 600C plus the excess sub-portion 616F and the excess portion 606A does not exceed the 32-bit length, the interval packing unit 64 may determine whether any of the intervals 65 have any available space. The interval packing unit 64 may determine that interval 65B includes available space 620B. The interval packing unit 64 may proceed to pack any symbols from less important subbands into the available space 620B.

Although described above as specifying excess portions of symbols in intervals above the current interval in the symbol stack, the techniques may be performed such that excess portions are specified in any previous or future interval. The excess portion (which may also be referred to as "slipover") may, in other words, flow forward to future intervals and then loop back to the beginning of the packet. Furthermore, while described with respect to packets, the techniques may be performed with respect to streams in which the slipover may flow forward to future intervals or backwards to past intervals. In the context of streams, there may not be any looping back/forward, and as such, the number of intervals into which the slipover is capable of flowing may be limited.

Returning to the example of FIG. 2A, the interval packing unit 64 may output the intervals 65 to the error resiliency unit 66. The error resiliency unit 66 may represent a unit configured to apply error resiliency to the intervals 65 to obtain error resilient intervals, which the error resiliency unit 66 may specified in the bitstream 25.

FIG. 2B is a block diagram illustrating an example of the audio decoder of FIG. 1 that may perform various aspects of the techniques described in this disclosure. As shown in the example of FIG. 2B, the audio decoder 24 includes an error detection unit 70, an interval unpacking unit 72, an entropy decoding unit 74, and an ADPCM audio decoder 76.

The error detection unit 70 may represent a unit configured to perform error detection with respect to the intervals 65' specified in the bitstream 25 to detect a presence of one or more errors 71 in one or more of the intervals 65' (where the prime notation (') denotes that the intervals 65 may have been impacted by bit errors 71). The error detection unit 70 may determine the errors 71 in a manner specified by the corresponding error resiliency scheme listed above. The error detection unit 70 may specify the errors 71 as an error bit mask for each of the intervals, which may identify which of the bits of the intervals are errors. As such, the errors 71 may be referred to herein as "error bit mask 71." The error detection unit 70 may also obtain, from the bitstream 25, the intervals 65' and output the intervals 65' to the interval unpacking unit 72.

The interval unpacking unit 72 may operate in a manner reciprocal to the interval packing unit 64 discussed above with respect to the example of FIGS. 2 and 4A-4F. That is, the interval unpacking unit 72 may systematically obtain (or, in some instances, parse) the symbols from the intervals 65'. More information concerning how the interval unpacking unit 72 may obtain the symbols from the intervals is described with respect to the following FIG. 5.

Figure 5A:
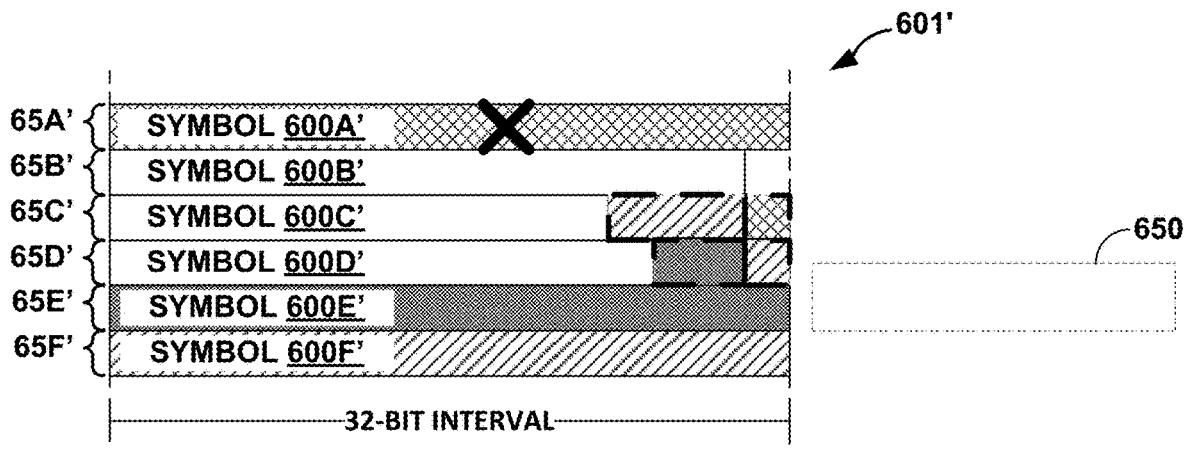
FIGS. 5A-5H are diagrams illustrating example operation of the interval unpacking unit shown in FIG. 2B in performing various aspects of the techniques described in this disclosure.
Figure 5B:
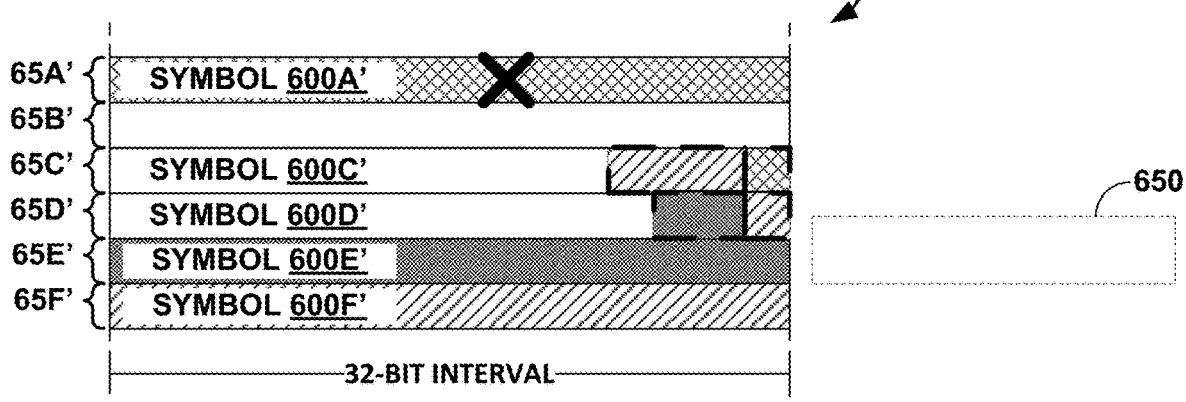

FIGS. 5A-5H are diagrams illustrating example operation of the interval unpacking unit shown in FIG. 2B in performing various aspects of the techniques described in this disclosure. Referring first to the example of FIG. 5A, the interval unpacking unit 72 may begin at a top of packet 601', parsing the symbol 600A' from interval 65A'. Responsive to determining that the interval 65A' only stores a portion of the symbol 600A', the interval unpacking unit 72 may determine whether excess portion 606A' is stored to a local stack 650. Response to determining that the local stack 650 is empty (or, in other words, does not store the excess portion 606A'), the interval unpacking unit 72 may mark the symbol 600A' as unavailable (denoted by the "X"), and proceed to process the next interval 65B' as shown in the example of FIG. 5B.

The interval unpacking unit 72 may parse the symbol 600B' from the interval 65B', providing the symbol 600B' to the entropy decoding unit 74. The result of parsing symbol 600B' from the interval 65B' is shown in the example of FIG. 5B.

Figure 5C:
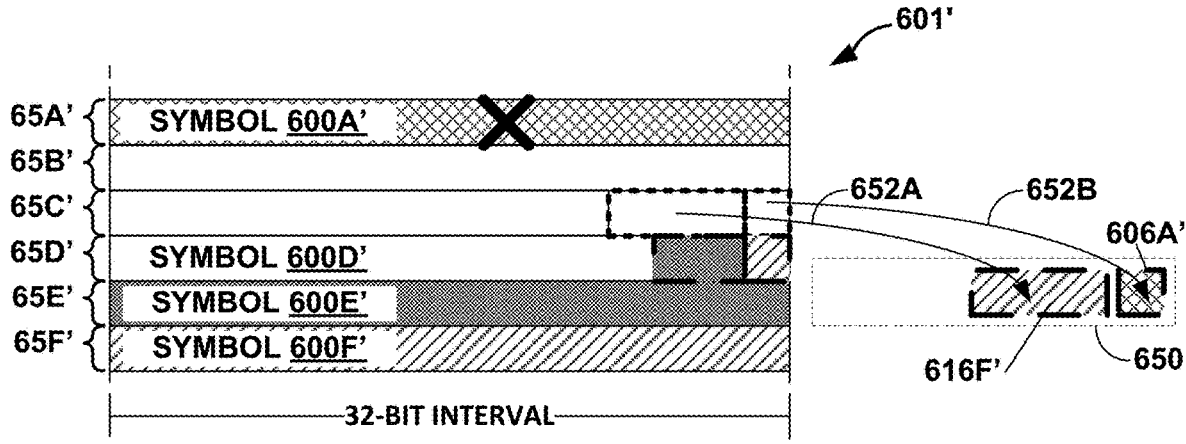

Referring next to the example of FIG. 5C, the interval unpacking unit 72 may parse the symbol 600C' from the interval 65C', providing the symbol 600C' to the entropy decoding unit 74. The interval unpacking unit 72 may also push the excess sub-portion 616F' and the excess portion 606A' onto the local stack 650 (as denoted by arrows 652A and 652B).

Figure 5D:
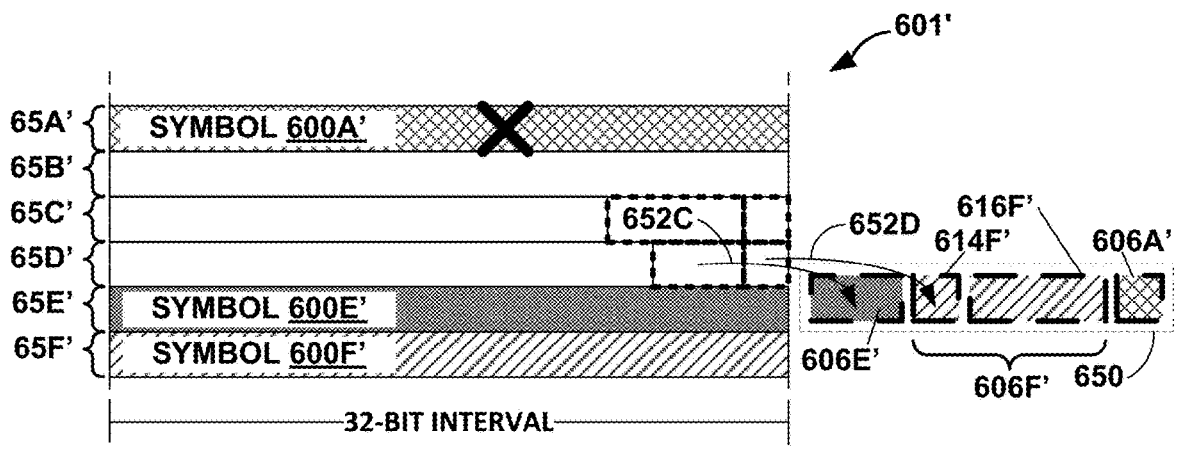

Referring next to the example of FIG. 5D, the interval unpacking unit 72 may parse the symbol 600D' from the interval 65D', providing the symbol 600D' to the entropy decoding unit 74. The interval unpacking unit 72 may also push the excess portion 606E' and the sub-portion 614F' onto the local stack 650 (as denoted by arrows 652C and 652D).

Figure 5E:
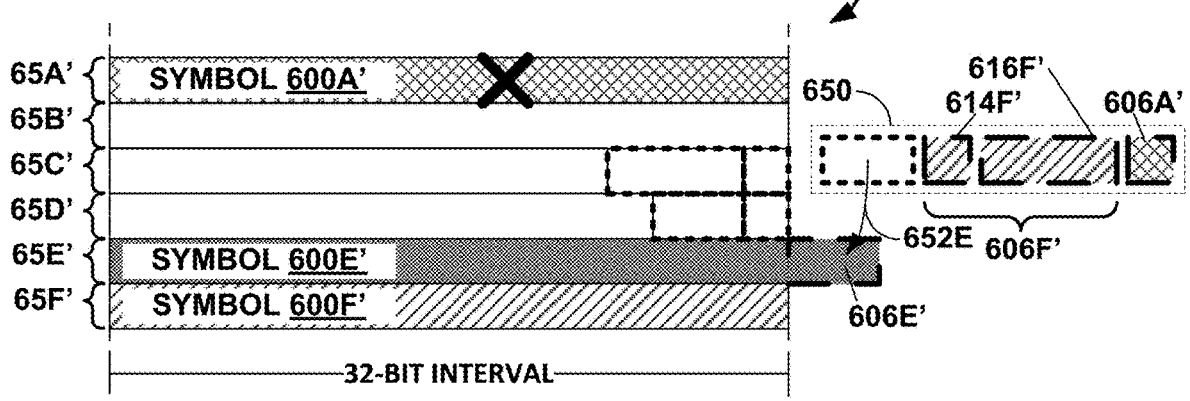

Referring next to the example of FIG. 5E, the interval unpacking unit 72 may parse the symbol 600E' from the interval 65E'. The interval unpacking unit 72 may determine that the symbol 600E' is incomplete (e.g., the entropy decoding unit 74 may indicate that the symbol 600E' is incomplete). As such, the interval unpacking unit 72 may obtain, from the local stack 650 (and as denoted by arrow 652E), the excess portion 606E' previously pushed onto the local stack 650. The interval unpacking unit 72 may provide the reconstructed symbol 600E' to the entropy decoding unit 74, and proceed to unpacking symbol 600F'.

Figure 5F:
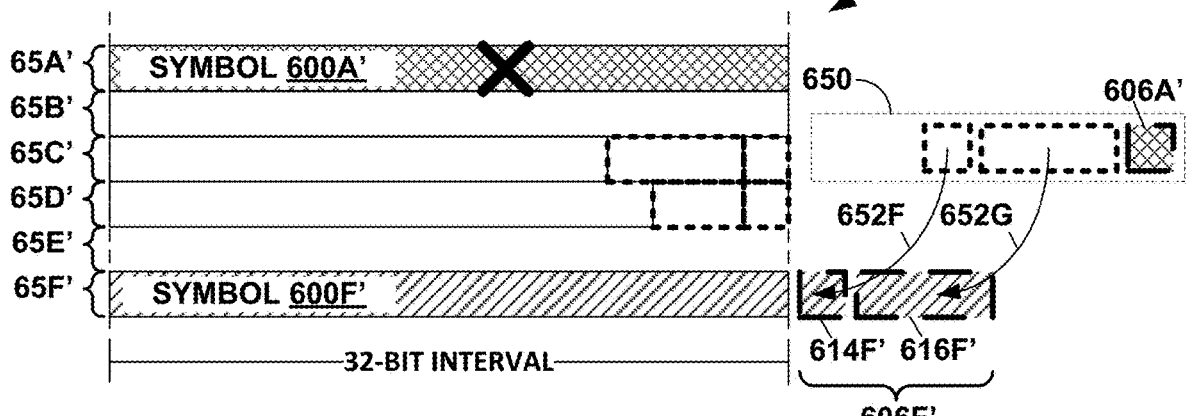

Referring next to the example of FIG. 5F, the interval unpacking unit 72 may parse the symbol 600F' from the interval 65F'. The interval unpacking unit 72 may determine that the symbol 600F' is incomplete (e.g., the entropy decoding unit 74 may indicate that the symbol 600F' is incomplete). As such, the interval unpacking unit 72 may obtain, from the local stack 650 (and as denoted by arrow 652F), the sub-portion 614F' previously pushed onto the local stack 650. The interval unpacking unit 72 may provide the reconstructed symbol 600E' to the entropy decoding unit 74, which may again indicate that the symbol 600F' is incomplete. The interval unpacking units 72 may obtain, from the local stack 650 (and as denoted by arrow 652G), the excess sub-portion 616F' previously pushed onto the local stack 650, thereby reconstructing the excess portion 606F' and the symbol 600F'. The interval unpacking unit 72 may provide the reconstructed symbol 600F' to the entropy decoding unit 74, and proceed to address any symbols 600A' marked as unavailable.

Figure 5G:
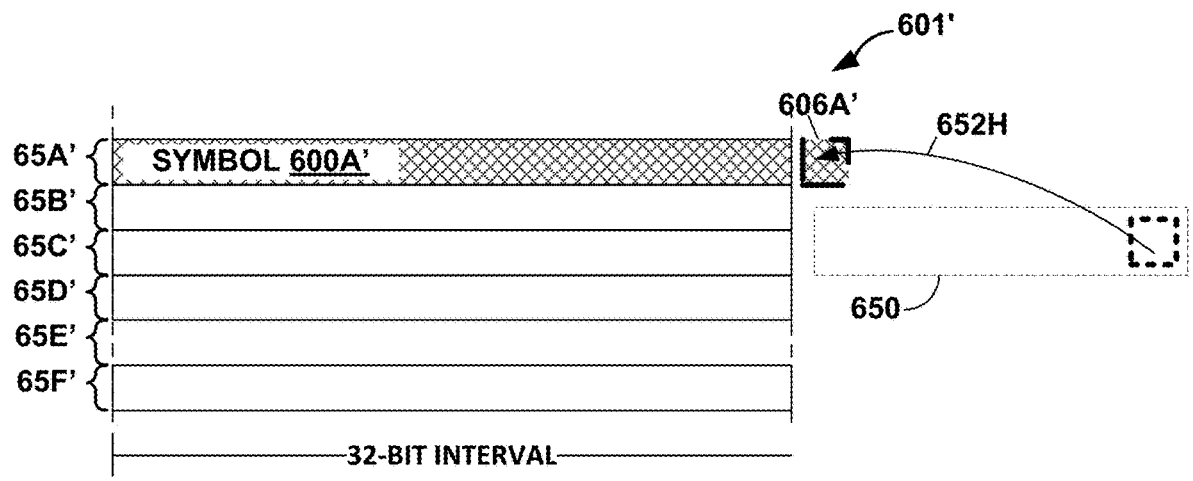

Referring next to the example of FIG. 5G, the interval unpacking unit 72 may determine that the symbol 600A' is marked as unavailable. Responsive to determining that the symbol 600A' is unavailable, the interval unpacking unit 72 may obtain, from the local stack 650 (and as denoted by arrow 652H), the excess portion 606A' previously pushed onto the local stack 650, thereby reconstructing the symbol 600A'. The interval unpacking unit 72 may provide the reconstructed symbol 600A' to the entropy decoding unit 74.

The interval unpacking unit 72 may also, although not shown in the example of FIGS. 5A-5F, determine whether any available space was used to store additional symbols from other subbands. The interval unpacking unit 72 may then unpack the additional symbols from the other subbands and provide the codewords 63' from these additional symbols to the entropy decoding unit 74.

Due to how the interval packing unit 64 may systematically pack the symbols 600 within the intervals 65, the interval unpacking unit 72 may systematically unpack the symbols 600' from the intervals 65' utilizing the local stack 650 in the manner described above without potentially requiring the interval packing unit 64 to signal any additional bits (or, in other words, overhead bits) to identify where the symbols 600 are specified in the intervals 65. Accordingly, the techniques may improve the operation of the interval packing unit 64 and the interval unpacking unit 72 themselves that the techniques may allow for more efficient representation of the symbols 600 in the intervals 65, which may reduce resource utilization (and thereby power consumption).

The foregoing FIGS. 5A-5H provided an example of successful unpacking of the intervals 65', however there may be one or more errors that occurred during transmission and/or processing of the intervals 65'. To illustrate, consider the example of FIG. 5H in which it is assumed that an error occurred in the portion 604E' of the symbol 600E. The interval unpacking unit 72 may determine a location of the error in the portion 604E', and parse the codewords 63' from the symbol 600E occurring before the detected error in the portion 604E', which may be decompressed to obtain a partial portion of the audio data 23'. The interval packing unit 72 may discard the remainder of the portion 604E' and the local stack, e.g., the excess portion 606E', 606F', and 606A' (as denoted by the "X").

Figure 5H:
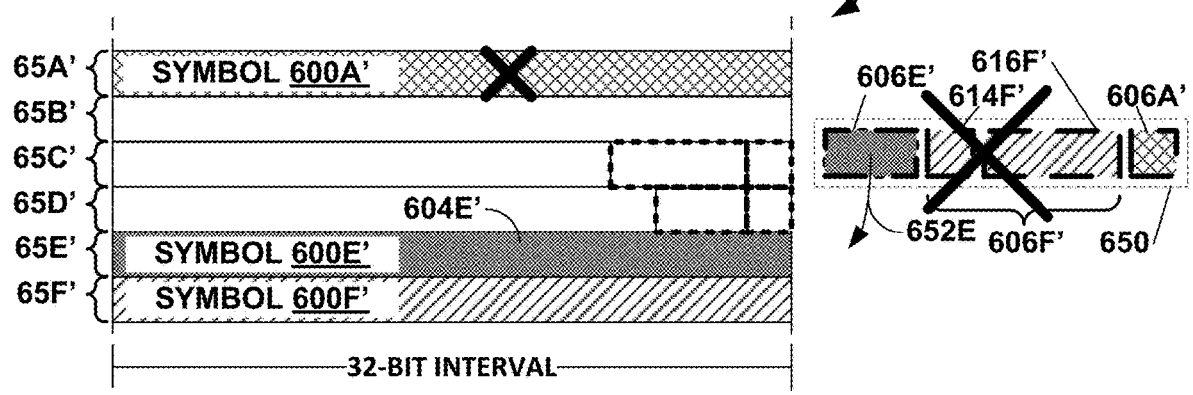

Alternatively, consider the example of FIG. 5H in which it is assumed that an error occurred in the excess portion 606F'. The interval unpacking unit 72 may determine a location of the error in the excess portion 606F', and parse the codewords 63' from the symbol 600F occurring in the portion 604F' and (when possible) before the detected error in the excess portion 606F', the combination of which may be decompressed to obtain a partial portion of the audio data 23'. The interval packing unit 72 may discard the remainder of the excess portion 606F' (which may, in some instances, be all of the excess portion 606F') and possibly some of the portion 604F' that relied on the excess portion 606F' (e.g., when a codeword is split between the portion 604F' and the excess portion 606F'). In this respect, errors may be limited to a single interval, and may not propagate to more than one interval.

Although described above as obtaining excess portions of symbols from intervals above the current interval in the symbol stack, the techniques may be performed such that excess portions are obtained from any previous or future interval. The excess portion (which may also be referred to as "slipover") may, in other words, flow forward to future intervals and then loop back to the beginning of the packet. Furthermore, while described with respect to packets, the techniques may be performed with respect to streams in which the slipover may flow forward to future intervals or backwards to past intervals. In the context of streams, there may not be any looping back/forward, and as such, the number of intervals into which the slipover is capable of flowing may be limited.

Returning to the example of FIG. 2B, the interval unpacking unit 72 may obtain the codewords 63' from the symbols in a manner reciprocal to how the interval packing unit 64 obtained the symbols from the codewords 63. Again, the prime notation (') may denote that the codewords 63' are generally the same as the codewords 63' but for the errors 71 that potentially resulted in loss of one or more of the original codewords 63. In any event, the interval unpacking unit 72 may identify, given that each of the codewords 63' is a unique codeword that is not a prefix of any other code, each of the codewords 63' of the codeword tuple forming each symbol, and extract each of the three codewords 63' from the symbol. The interval unpacking unit 72 may next organize each of the codewords 63' sequentially according to which of the subbands each of the codewords 63' correspond. The interval unpacking unit 63' may output the organized codewords 63' to entropy decoding unit 74.

The entropy decoding unit 74 may represent a unit configured to perform entropy decoding with respect to the codewords 63' to obtain compressed audio data 61' (which may also be referred to as compressed subbands 61'). The entropy decoding unit 74 may perform prefix-code entropy decoding, such as Huffman decoding, with respect to the codewords 62' to obtain the compressed subbands 61'. The entropy decoding unit 74 may output the compressed subbands 61' to the ADPCM audio decoder 76, which may perform ADPCM decompression with respect to the compressed subbands 61' to obtain the audio data 23' as described below in more detail with respect to the example of FIG. 3B.

Figure 10:
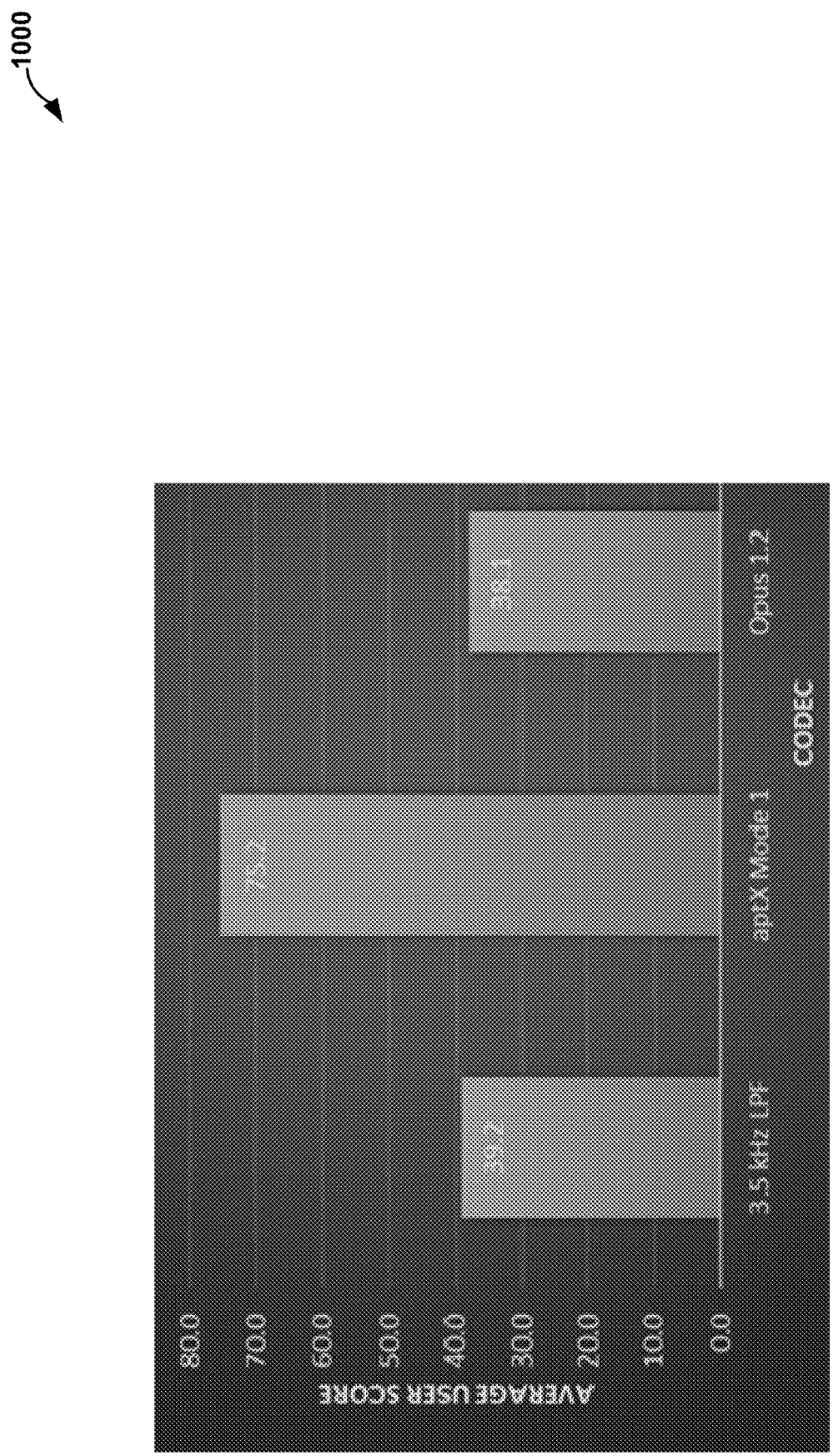
FIG. 10 is a diagram illustrating a graph demonstrating perceptual improvement as a result of the audio codec shown in FIG. 1 performing various aspects of the techniques described in this disclosure relative to other audio codecs.

FIG. 10 is a diagram illustrating a graph 1000 demonstrating perceptual improvement as a result of the audio codec shown in FIG. 1 performing various aspects of the techniques described in this disclosure relative to other audio codecs. Graph 1000 indicates that aptX mode 1, which is representative of aptX modified in accordance with the various aspects of the techniques described in this disclosure, sounded perceptually better with an average user score of 75.2 relative to other audio codecs, such as 3.5 kilo Hertz (kHz) low pass filter (LPF) audio codec, and an Opus 1.2 audio codec.

Figure 3A:
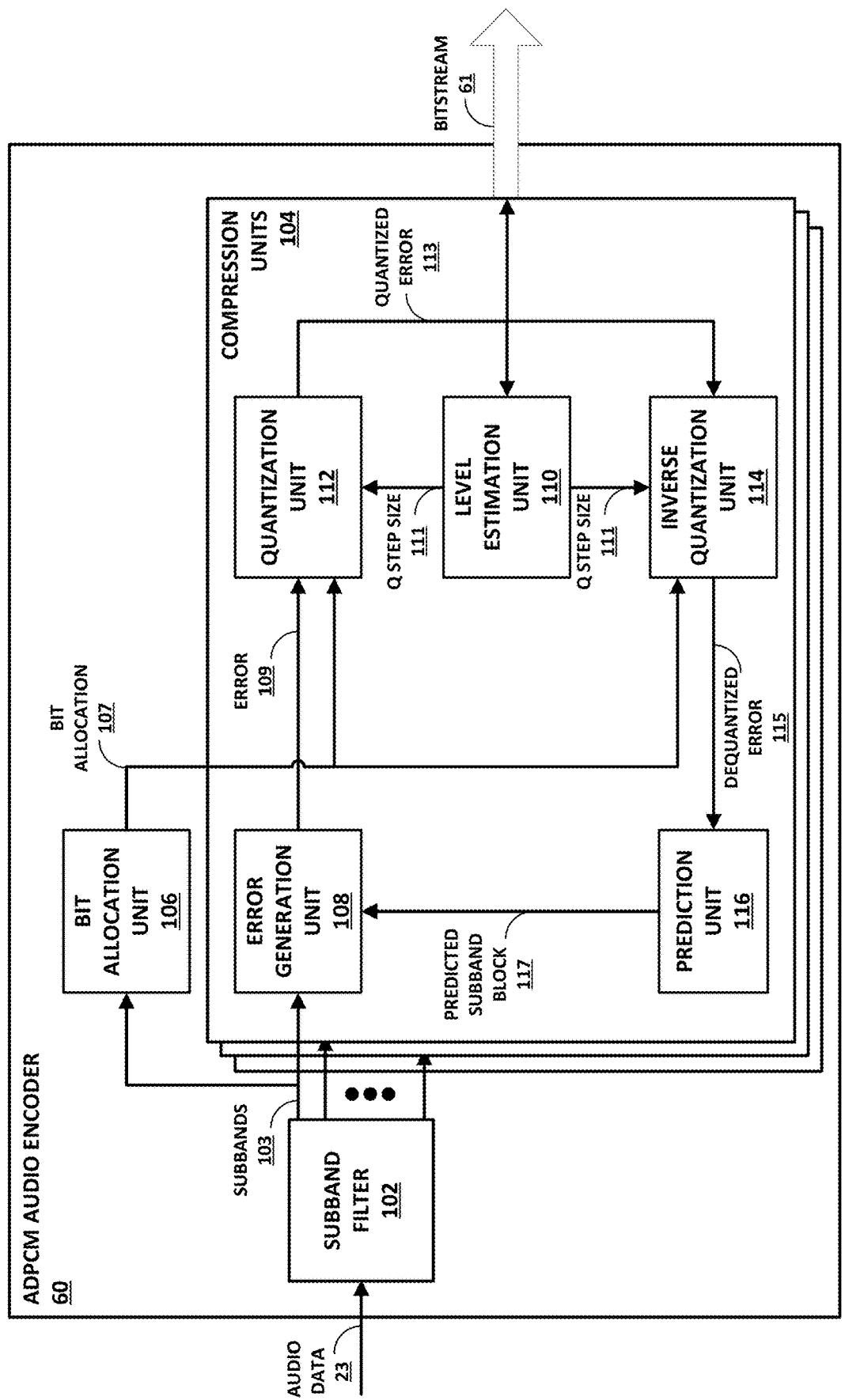
FIG. 3A is a block diagram illustrating an example of the ADPCM audio encoder of FIG. 2A in more detail.

FIG. 3A is a block diagram illustrating an example of the ADPCM audio encoder of FIG. 2A in performing various aspects of the techniques described in this disclosure. As shown in the example of FIG. 3A, the ADPCM audio encoder 60 includes a subband filter 102, compression units 104, and a bit allocation unit 106. The subband filter 102 may represent a unit configured to separate the audio data 23 (which may represent pulse code modulated—PCM—audio data) into different subbands 103 of the audio data 23 (or, more generically, different portions of the audio data 23). Examples of the subband filter 102 include a quadrature mirror filterbank (QMF) or a conjugate mirror filters (CMF, which may also be referred to as power symmetric filters—PSF). The subband filter 102 may output subbands 103 to the bit compression units 104 and the bit allocation unit 106.

The compression units 104 may represent one or more units configured to compress one or more of the subbands 103. In the example of FIG. 3A, the audio encoder 24 includes a compression unit of compression units 104 for each one of the subbands 103. However, the audio encoder 24 may include a single compression unit 104 that processes each of the subbands 103, or two or more compression units 104 that may process one or more of the subbands 103.

In any event, each of the compression units 104 may be configured to perform a form of compression referred to as adaptive differential pulse code modulation (ADPCM). Although described with respect to ADPCM, the techniques may be implemented with respect to any form of compression that relies on bit allocations or other indications of a current level of a current block of the audio data 23 and level estimation in order to obtain the level estimate indication. The compression units 104 may perform ADPCM with respect to the subbands 103 to obtain quantized errors 113, which may be formatted to form the bitstream 61.

The bit allocation unit 106 may represent a unit configured to perform, based on the subbands 103, bit allocation to obtain a bit allocation for each of the subbands 103. Although not shown in the example of FIG. 3A, the bit allocation unit 106 may receive a target bitrate or other indication of the target bitrate (such as a quality, SNR, etc.). The bit allocation unit 106 may then obtain, based on the target bitrate, a bit budget for a frame (or any set or adaptable number of samples) of the audio data 23.

The bit allocation unit 106 may analyze each of the subbands 103 to identify which of the subbands 103 include information salient in representing the soundfield captured by the audio data 23, and thereby allocate portions of the bit budget to one or more of the subbands 103. In some examples, the bit allocation unit 106 may determine a maximum peak to average power ratio (PAR) envelope for each of the subbands 103 and identify which of the subbands 103 should receive more bits than other ones of the subbands 103 (possibly performing differentiation and integration between the different subbands 103 to identify redundancies, etc.). The bit allocation unit 106 may, in some instances, identify a SNR for each of the subbands 103 as an alternative to the maximum PAR envelope or in conjunction with the maximum PAR envelope. The bit allocation unit 106 may then provide the bit allocation 107 for each of the subbands 107 to a corresponding one of the compression units 104.

As further shown in the example of FIG. 3A, the compression units 104 may each include an error generation unit 108, a level estimation unit 110, a quantization unit 112, an inverse quantization unit 114, and a prediction unit 116. The error generation unit 108 may represent a unit configured to obtain an error 109 as a difference between a current block of the subband 103, and a predicted subband block 117 predicted from a previous block of the subband 103. The previous block of the subband 103 may include a block that is temporally directly before the current block of the subband 103. The error generation unit 108 may output the error 109 to quantization unit 112.

The level estimation unit 110 may represent a unit configured to perform level estimation with respect to previous blocks of the subband 103. The level estimation unit 110 may receive quantized errors 113 as codewords having, as one example, bit lengths of two to nine bits. The quantized errors 113 may represent an example of previous indications of the levels of previous blocks of subband 103.

The level estimation unit 110 may perform, based on one or more of the quantized errors 113, level estimation 110 to obtain quantization step size 111 ("Q step size 111"). More information concerning how to perform level estimation with respect to only quantized errors 113 can be found at section 3.2.3 (in reference to Adaptive Quantizers and referred to as "adaptive-backward prediction"), entitled "VECTOR QUANTIZATION AND SCALAR LINEAR PREDICTION FOR WAVEFORM CODING OF SPEECH AT 16 kb§," and dated June 1989. The level estimation unit 110 may output the quantization step size 111 to both the quantization unit 112 and the inverse quantization unit 114.

The quantization unit 112 may represent a unit configured to perform uniform or non-uniform quantization with respect to the error 109. Uniform quantization may refer to quantization in which the quantization levels or intervals are uniform (or, in other words, the same). Non-uniform quantization may refer to quantization in which the quantization levels or intervals are not uniform. For purposes of illustration, it is assumed that quantization unit 112 may perform non-uniform quantization as the audio data 23 may generally not have a uniform distribution of samples especially in the presence of rapidly changing levels.

In any event, the quantization unit 112 may perform adaptive quantization (which is a form of lossy compression) based on quantization step size 111, where such quantization is adaptive given that the quantization step size 111 may change. The quantization unit 112 may perform, based on the quantization step size 111, non-uniform quantization with respect to the error 109 to obtain the quantized error 113. The quantization unit 112 may output the quantized error 113 to the level estimation unit 110, as noted above, and the inverse quantization unit 114.

The inverse quantization unit 114 may represent a unit configured to perform inverse quantization, based on the quantization step size 111, with respect to the quantized error 113 to obtain the dequantized error 115. In this respect, the inverse quantization unit 114 may operate reciprocally to the quantization unit 112. The inverse quantization unit 114 may output the dequantized error 115 to the prediction unit 116.

The prediction unit 116 may represent a unit configured to predict, based on dequantized error 115, subband 103 to obtain predicted subband block 117. The prediction unit 116 may obtain the predicted subband block 117 by, as one example, adding dequantized error 115 to a previously predicted subband block 117 for subband 103. The prediction unit 116 may output the predicted subband block 117 to the error generation unit 108, as noted above.

Figure 3B:
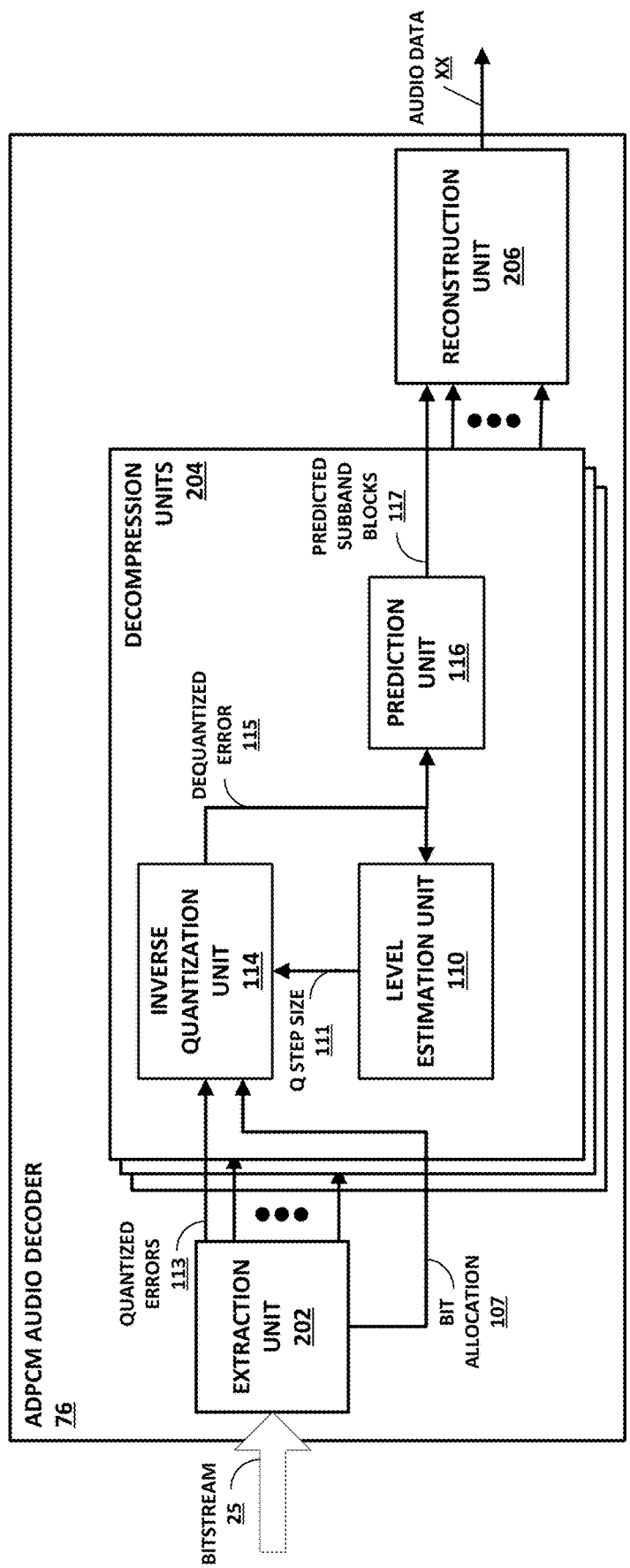
FIG. 3B is a block diagram illustrating an example of the ADPCM audio decoder of FIG. 2B in more detail.

FIG. 3B is a block diagram illustrating an example of the audio decoder of FIG. 1 in performing various aspects of the techniques described in this disclosure. As shown in the example of FIG. 3B, the ADPCM audio decoder 76 includes an extraction unit 202, decompression units 204, and a reconstruction unit 206. The extraction unit 202 may represent a unit configured to extract or otherwise parse various values from the bitstream 61, such as the quantized errors 113 and corresponding bit allocations 107.

The decompression units 204 may each represent a unit configured to perform reciprocal operations to those described above with respect to compression units 104. In the example of FIG. 3B, the audio decoder 44 includes a decompression unit of decompression units 204 for each one of the quantized errors 103. However, the ADPCM audio decoder 76 may include a single decompression unit 204 that processes each of the quantized errors 113, or two or more decompression units 204 that may process one or more of the quantized errors 113.

Each of the decompression units 204 may perform inverse ADPCM compression to obtain predicted subband blocks 117. Each of decompression units 204 may output predicted subband blocks 117 to reconstruction unit 206. Although described with respect to inverse ADPCM, the techniques may be implemented with respect to any form of decompression that relies on bit allocations or other indications of a current level of a current block of the audio data 23 and level estimation in order to obtain the level estimate indication 111. The decompression units 204 may output predicted subband blocks 117 to reconstruction unit 206.

The reconstruction unit 206 may represent a unit configured to reconstruct, based on predicted subband blocks 117 from each of the decompression units 204, audio data 23'. The reconstruction unit 206 may apply an inverse subband filter (not shown) in a manner reciprocal to the subband filter 102 with respect to the predicted subband blocks 117 to obtain the audio data 23'.

As further shown in the example of FIG. 3B, each of the decompression units 204 include a level estimation unit 110, an inverse quantization unit 114, and a prediction unit 116. The level estimation unit 110, the inverse quantization unit 114, and the prediction unit 116 of the decompression units 204 may each operate in a manner substantially similar to, if not the same as, the level estimation unit 110, the inverse quantization unit 114, and the prediction unit 116, respectively, of the compression units 104 of the ADPCM audio encoder 60 shown in the example of FIG. 3A.

The level estimation unit 110 of the decompression units 204 may represent a unit configured to perform level estimation with respect to previous blocks of the subband 103. The level estimation unit 110 may receive quantized errors 113 as codewords having, as one example, bit lengths of two to nine bits. The quantized errors 113 may represent an example of previous indications of the levels of previous blocks of subband 103.

The level estimation unit 110 may perform, based on one or more of the quantized errors 113, level estimation 110 to obtain quantization step size 111 ("Q step size 111"). More information concerning how to perform level estimation with respect to only quantized errors 113 can be found at section 3.2.3 (in reference to Adaptive Quantizers and referred to as "adaptive-backward prediction") in a Thesis Paper by Watts, Lloyd, entitled "VECTOR QUANTIZATION AND SCALAR LINEAR PREDICTION FOR WAVEFORM CODING OF SPEECH AT 16 kb/s," and dated June 1989. The level estimation unit 110 may output the quantization step size 111 to the inverse quantization unit 114.

The inverse quantization unit 114 may represent a unit configured to perform inverse quantization, based on the quantization step size 111, with respect to the quantized error 113 to obtain the dequantized error 115. In this respect, the inverse quantization unit 114 may operate reciprocally to the quantization unit 112 of the compression units 104. The inverse quantization unit 114 may output the dequantized error 115 to the prediction unit 116.

The prediction unit 116 may represent a unit configured to predict, based on dequantized error 115, subband 103 to obtain predicted subband block 117. The prediction unit 116 may obtain the predicted subband block 117 by, as one example, adding dequantized error 115 to a previously predicted subband block 117 for subband 103. The prediction unit 116 may output the predicted subband block 117 to the reconstruction unit 206, as noted above.

Figure 6:
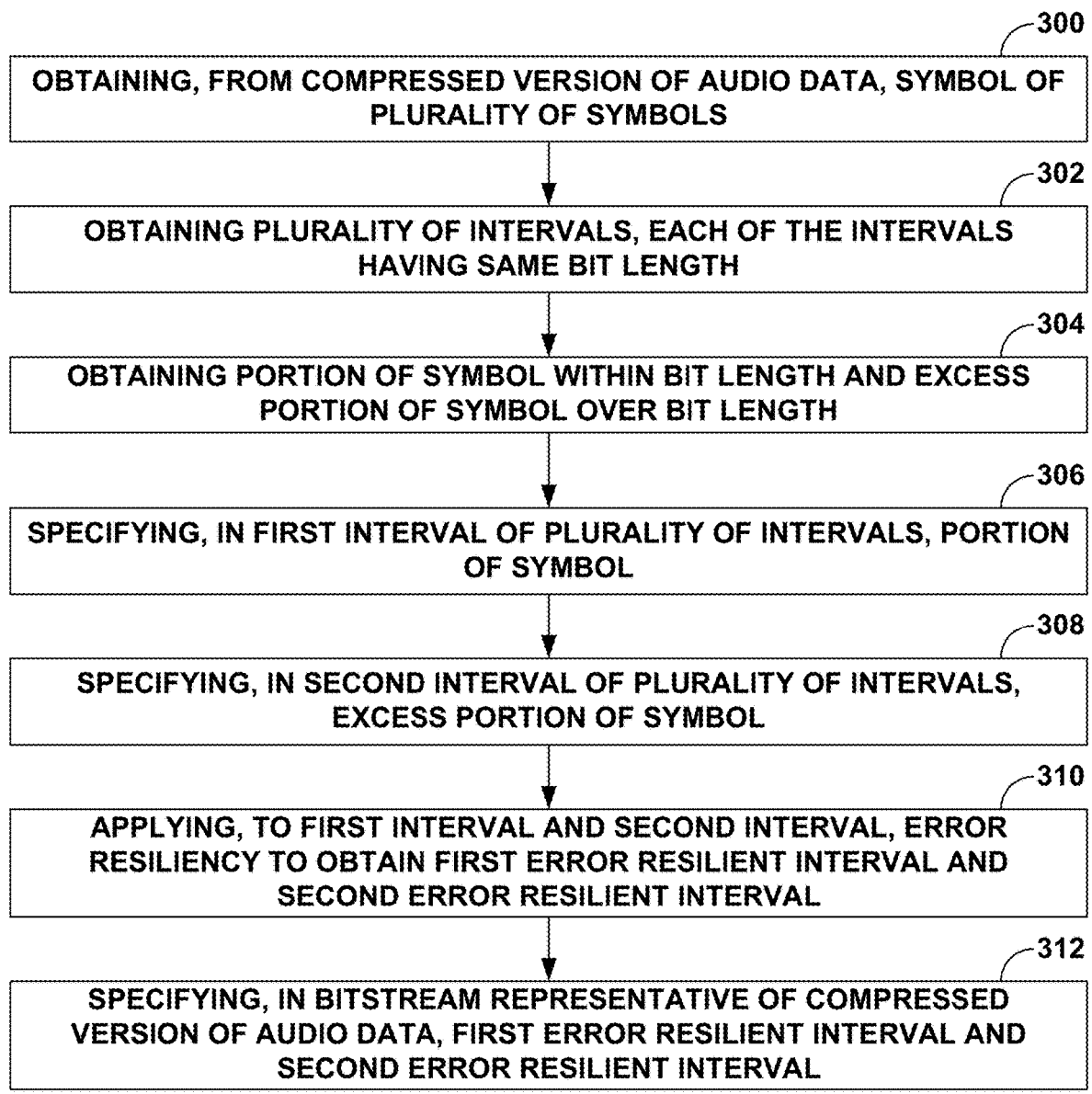
FIG. 6 is a flowchart illustrating example operation of the source device of FIG. 1 in performing various aspects of the techniques described in this disclosure.

FIG. 6 is a flowchart illustrating example operation of the source device 12 of FIG. 1 in performing various aspects of the techniques described in this disclosure. As shown in the example of FIG. 6, the source device 12 may first obtain, from a compressed version of the audio data, a symbol of a plurality of symbols (300). The source device 12 may next obtain a plurality of intervals, each of the intervals having a same bit length (302). The source device may also obtain a portion of the symbol within the bit length and an excess portion of the symbol over the bit length (304). The source device 12 may further specify, in a first interval of the plurality of intervals, the portion of the symbol (306). The source device 12 may also specify, in a second interval of the plurality of intervals, the excess portion of the symbol (308). The source device 12 may apply, to the first interval and the second interval, error resiliency to obtain a first error resilient interval and a second error resilient interval (310). The source device 12 may further specify, in a bitstream representative of the compressed version of the audio data, the first error resilient interval and the second error resilient interval (312).

Figure 7:
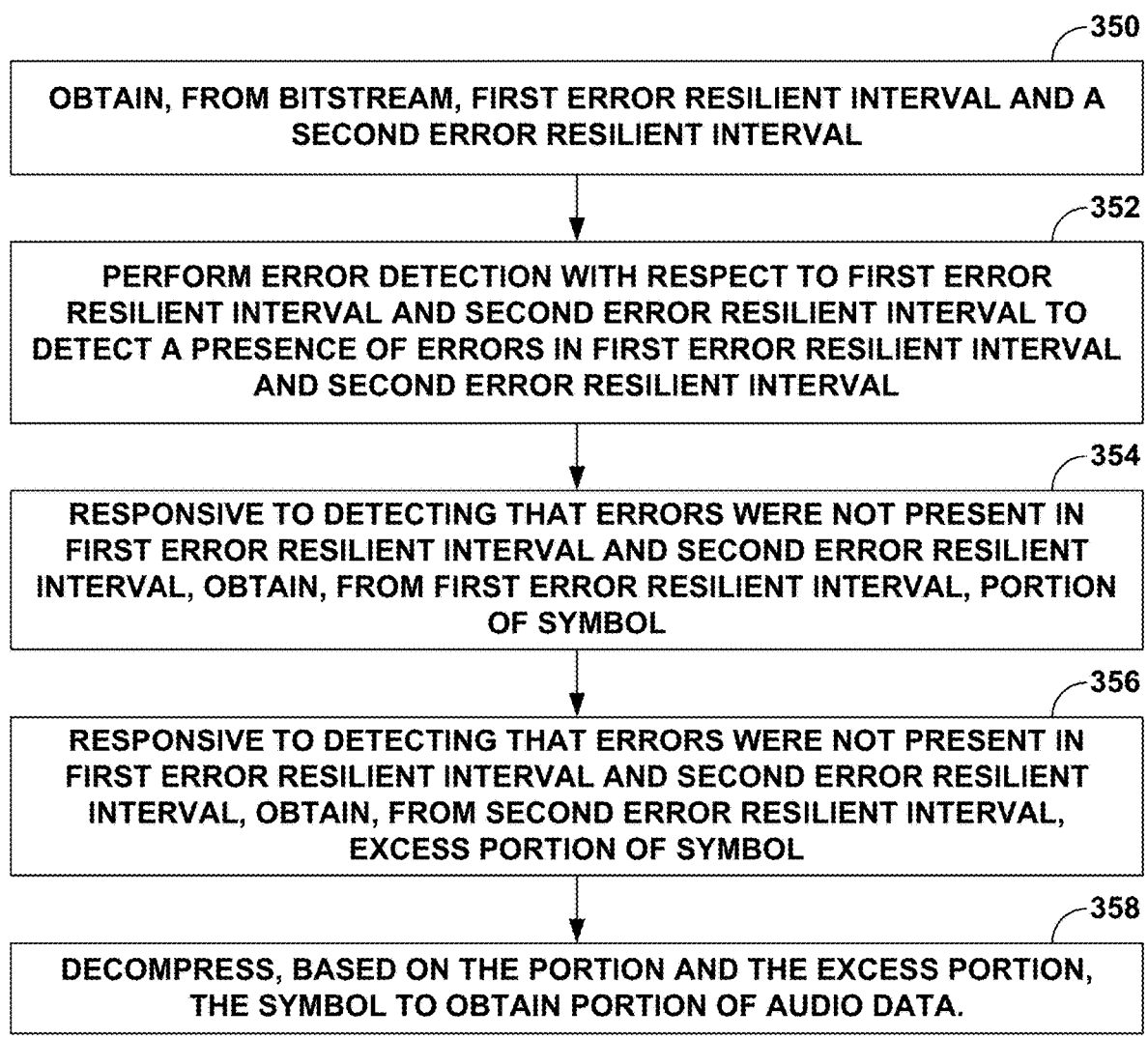
FIG. 7 is a flowchart illustrating example operation of the sink device of FIG. 1 in performing various aspects of the techniques described in this disclosure.

FIG. 7 is a flowchart illustrating example operation of the sink device 14 of FIG. 1 in performing various aspects of the techniques described in this disclosure. As shown in the example of FIG. 7, the sink device 14 may obtain, from the bitstream, a first error resilient interval and a second error resilient interval, each of the first error resilient interval and the second error resilient interval having a same bit length (350). The sink device 14 may further perform error detection with respect to the first error resilient interval and the second error resilient interval to detect a presence of one or more errors in one or more of the first error resilient interval and the second error resilient interval (352).

The sink device 14 may, responsive to detecting that the one or more errors were not present in the first error resilient interval and the second error resilient interval, obtain, from the first error resilient interval, a portion of a symbol within the bit length, the symbol indicative of the compressed version of the audio data (354), and obtain, from the second error resilient interval, an excess portion of the symbol over the bit length (356). The sink device 14 may next decompress, based on the portion and the excess portion, the symbol to obtain a portion of the audio data (358).

Figure 8:
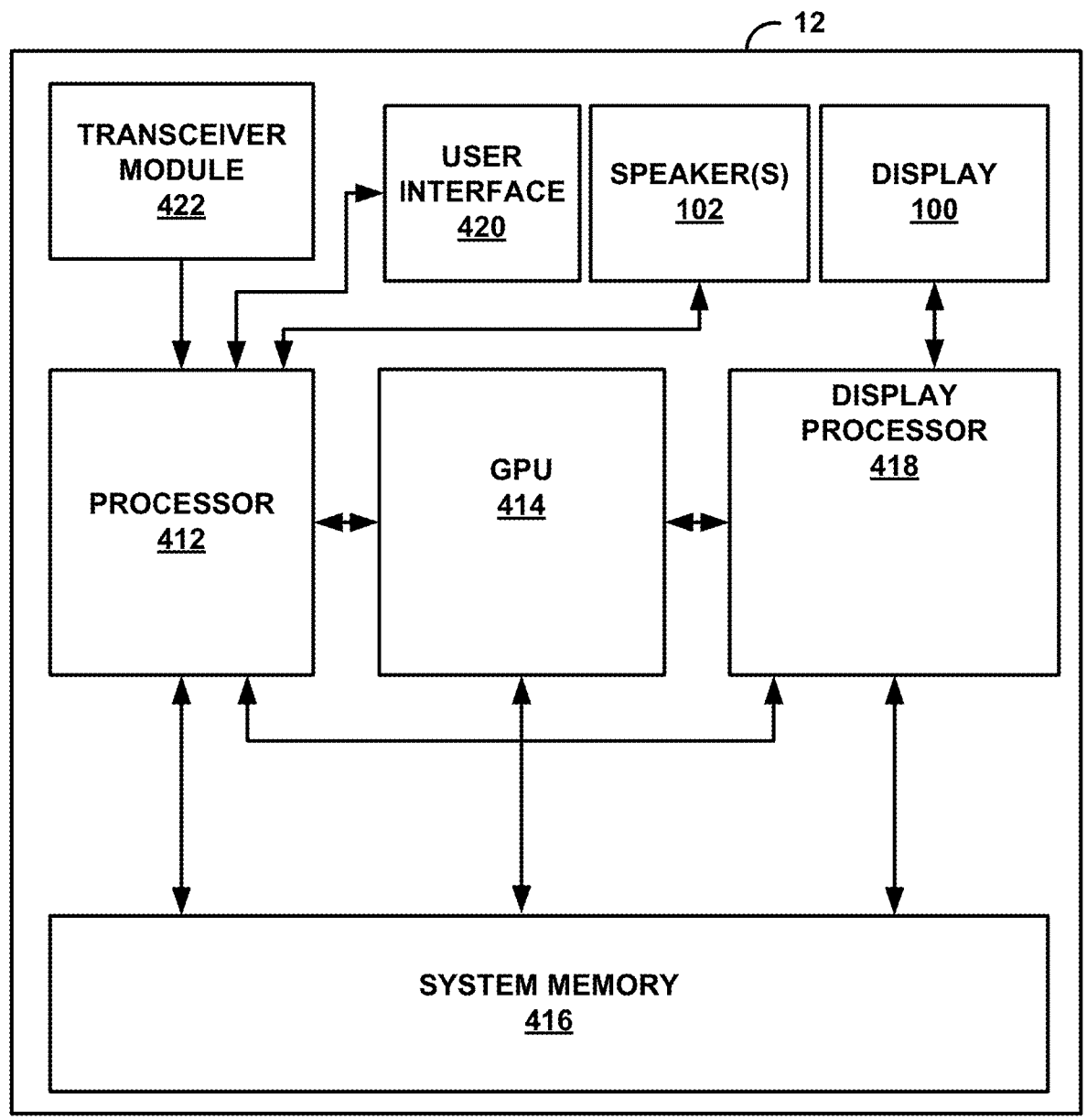
FIG. 8 is a block diagram illustrating example components of the source device shown in the example of FIG. 1.

FIG. 8 is a block diagram illustrating example components of the source device 12 shown in the example of FIG. 1. In the example of FIG. 8, the source device 12 includes a processor 412, a graphics processing unit (GPU) 414, system memory 416, a display processor 418, one or more integrated speakers 102, a display 100, a user interface 420, and a transceiver module 422. In examples where the source device 12 is a mobile device, the display processor 418 is a mobile display processor (MDP). In some examples, such as examples where the source device 12 is a mobile device, the processor 412, the GPU 414, and the display processor 418 may be formed as an integrated circuit (IC).

For example, the IC may be considered as a processing chip within a chip package, and may be a system-on-chip (SoC). In some examples, two of the processors 412, the GPU 414, and the display processor 418 may be housed together in the same IC and the other in a different integrated circuit (i.e., different chip packages) or all three may be housed in different ICs or on the same IC. However, it may be possible that the processor 412, the GPU 414, and the display processor 418 are all housed in different integrated circuits in examples where the source device 12 is a mobile device.

Examples of the processor 412, the GPU 414, and the display processor 418 include, but are not limited to, one or more digital signal processors (DSPs), general purpose microprocessors, application specific integrated circuits (ASICs), field programmable logic arrays (FPGAs), or other equivalent integrated or discrete logic circuitry. The processor 412 may be the central processing unit (CPU) of the source device 12. In some examples, the GPU 414 may be specialized hardware that includes integrated and/or discrete logic circuitry that provides the GPU 414 with massive parallel processing capabilities suitable for graphics processing. In some instances, GPU 14 may also include general purpose processing capabilities, and may be referred to as a general purpose GPU (GPGPU) when implementing general purpose processing tasks (i.e., non-graphics related tasks). The display processor 418 may also be specialized integrated circuit hardware that is designed to retrieve image content from the system memory 416, compose the image content into an image frame, and output the image frame to the display 100.

The processor 412 may execute various types of the applications 20. Examples of the applications 20 include web browsers, e-mail applications, spreadsheets, video games, other applications that generate viewable objects for display, or any of the application types listed in more detail above. The system memory 416 may store instructions for execution of the applications 20. The execution of one of the applications 20 on the processor 412 causes the processor 412 to produce graphics data for image content that is to be displayed and the audio data 21 that is to be played (possibly via integrated speaker 102). The processor 412 may transmit graphics data of the image content to the GPU 414 for further processing based on and instructions or commands that the processor 412 transmits to the GPU 414.

The processor 412 may communicate with the GPU 414 in accordance with a particular application processing interface (API). Examples of such APIs include the DirectX® API by Microsoft®, the OpenGL® or OpenGL ES® by the Khronos group, and the OpenCL™; however, aspects of this disclosure are not limited to the DirectX, the OpenGL, or the OpenCL APIs, and may be extended to other types of APIs. Moreover, the techniques described in this disclosure are not required to function in accordance with an API, and the processor 412 and the GPU 414 may utilize any technique for communication.

The system memory 416 may be the memory for the source device 12. The system memory 416 may comprise one or more computer-readable storage media. Examples of the system memory 416 include, but are not limited to, a random access memory (RAM), an electrically erasable programmable read-only memory (EEPROM), flash memory, or other medium that can be used to carry or store desired program code in the form of instructions and/or data structures and that can be accessed by a computer or a processor.

In some aspects, the system memory 416 may include instructions that cause the processor 412, the GPU 414, and/or the display processor 418 to perform the functions ascribed in this disclosure to the processor 412, the GPU 414, and/or the display processor 418. Accordingly, the system memory 416 may be a computer-readable storage medium having instructions stored thereon that, when executed, cause one or more processors (e.g., the processor 412, the GPU 414, and/or the display processor 418) to perform various functions.

The system memory 416 may include a non-transitory storage medium. The term "non-transitory" indicates that the storage medium is not embodied in a carrier wave or a propagated signal. However, the term "non-transitory" should not be interpreted to mean that the system memory 416 is non-movable or that its contents are static. As one example, the system memory 416 may be removed from the source device 12, and moved to another device. As another example, memory, substantially similar to the system memory 416, may be inserted into the source device 12. In certain examples, a non-transitory storage medium may store data that can, over time, change (e.g., in RAM).

The user interface 420 may represent one or more hardware or virtual (meaning a combination of hardware and software) user interfaces by which a user may interface with the source device 12. The user interface 420 may include physical buttons, switches, toggles, lights or virtual versions thereof. The user interface 420 may also include physical or virtual keyboards, touch interfaces—such as a touchscreen, haptic feedback, and the like.

The processor 412 may include one or more hardware units (including so-called "processing cores") configured to perform all or some portion of the operations discussed above with respect to one or more of the mixing unit 22, the audio encoder 24, the wireless connection manager 26, the audio manager 28, and the wireless communication units 30. The transceiver module 422 may represent a unit configured to establish and maintain the wireless connection between the source device 12 and the sink device 14. The transceiver module 422 may represent one or more receivers and one or more transmitters capable of wireless communication in accordance with one or more wireless communication protocols. The transceiver module 422 may perform all or some portion of the operations of one or more of the wireless connection manager 26 and the wireless communication units 30.

Figure 9:
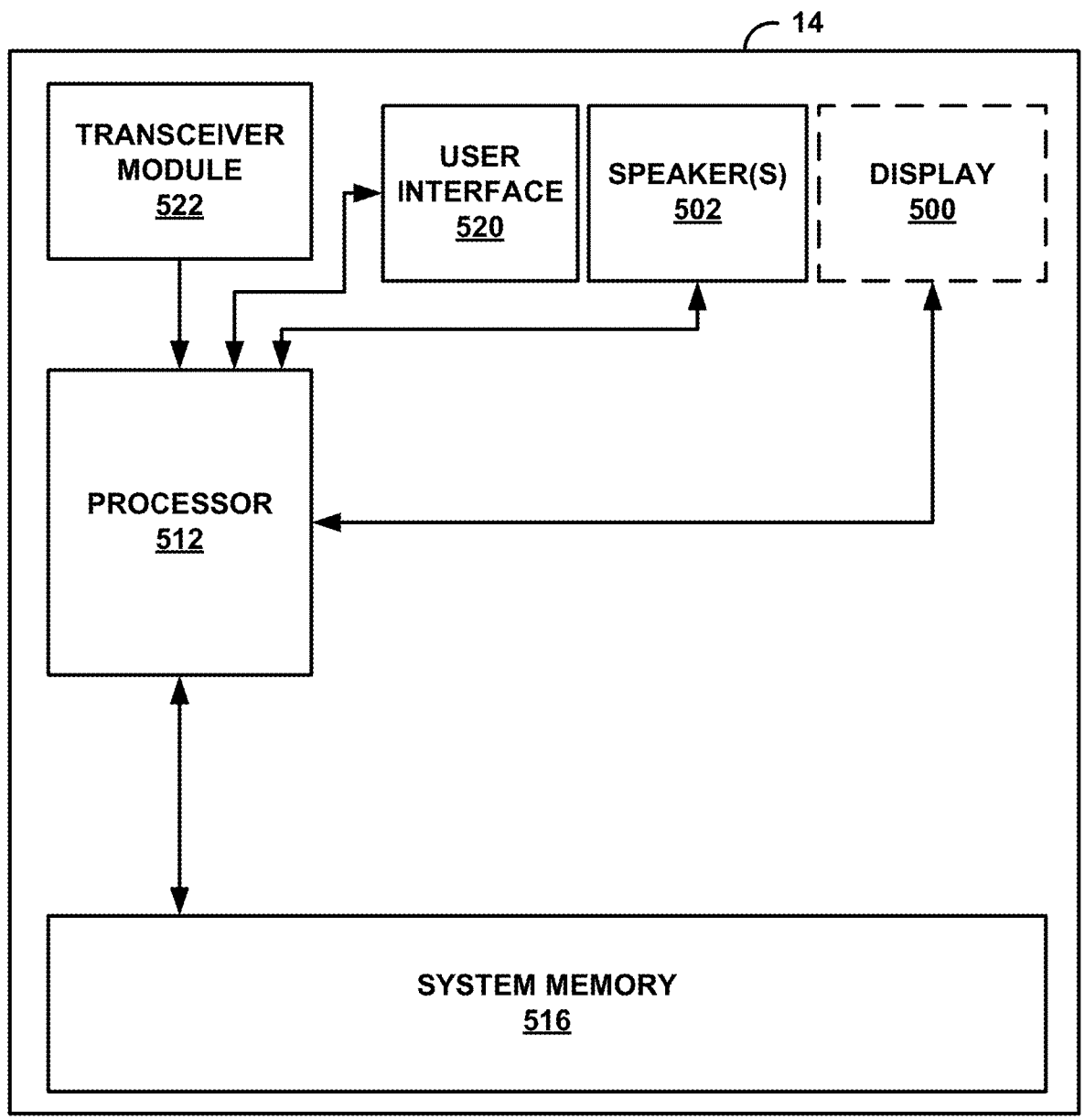
FIG. 9 is a block diagram illustrating exemplary components of the sink device shown in the example of FIG. 1.

FIG. 9 is a block diagram illustrating exemplary components of the sink device 14 shown in the example of FIG. 1. Although the sink device 14 may include components similar to that of the source device 12 discussed above in more detail with respect to the example of FIG. 8, the sink device 14 may, in certain instances, include only a subset of the components discussed above with respect to the source device 12.

In the example of FIG. 9, the sink device 14 includes one or more speakers 502, a processor 512, a system memory 516, a user interface 520, and a transceiver module 522. The processor 512 may be similar or substantially similar to the processor 412. In some instances, the processor 512 may differ from the processor 412 in terms of total processing capacity or may be tailored for low power consumption. The system memory 516 may be similar or substantially similar to the system memory 416. The speakers 502, the user interface 520, and the transceiver module 522 may be similar to or substantially similar to the respective speakers 402, user interface 420, and transceiver module 422. The sink device 14 may also optionally include a display 500, although the display 500 may represent a low power, low resolution (potentially a black and white LED) display by which to communicate limited information, which may be driven directly by the processor 512.

The processor 512 may include one or more hardware units (including so-called "processing cores") configured to perform all or some portion of the operations discussed above with respect to one or more of the wireless connection manager 40, the wireless communication units 42, the audio decoder 44, and the audio manager 26. The transceiver module 522 may represent a unit configured to establish and maintain the wireless connection between the source device 12 and the sink device 14. The transceiver module 522 may represent one or more receivers and one or more transmitters capable of wireless communication in accordance with one or more wireless communication protocols. The transceiver module 522 may perform all or some portion of the operations of one or more of the wireless connection manager 40 and the wireless communication units 28.

The foregoing techniques may be performed with respect to any number of different contexts and audio ecosystems. A number of example contexts are described below, although the techniques should be limited to the example contexts. One example audio ecosystem may include audio content, movie studios, music studios, gaming audio studios, channel based audio content, coding engines, game audio stems, game audio coding/rendering engines, and delivery systems.

The movie studios, the music studios, and the gaming audio studios may receive audio content. In some examples, the audio content may represent the output of an acquisition. The movie studios may output channel based audio content (e.g., in 2.0, 5.1, and 7.1) such as by using a digital audio workstation (DAW). The music studios may output channel based audio content (e.g., in 2.0, and 5.1) such as by using a DAW. In either case, the coding engines may receive and encode the channel based audio content based one or more codecs (e.g., AAC, AC3, Dolby True HD, Dolby Digital Plus, and DTS Master Audio) for output by the delivery systems. The gaming audio studios may output one or more game audio stems, such as by using a DAW. The game audio coding/rendering engines may code and or render the audio stems into channel based audio content for output by the delivery systems. Another example context in which the techniques may be performed comprises an audio ecosystem that may include broadcast recording audio objects, professional audio systems, consumer on-device capture, HOA audio format, on-device rendering, consumer audio, TV, and accessories, and car audio systems.

The broadcast recording audio objects, the professional audio systems, and the consumer on-device capture may all code their output using HOA audio format. In this way, the audio content may be coded using the HOA audio format into a single representation that may be played back using the on-device rendering, the consumer audio, TV, and accessories, and the car audio systems. In other words, the single representation of the audio content may be played back at a generic audio playback system (i.e., as opposed to requiring a particular configuration such as 5.1, 7.1, etc.), such as audio playback system 16.

Other examples of context in which the techniques may be performed include an audio ecosystem that may include acquisition elements, and playback elements. The acquisition elements may include wired and/or wireless acquisition devices (e.g., microphones), on-device surround sound capture, and mobile devices (e.g., smartphones and tablets). In some examples, wired and/or wireless acquisition devices may be coupled to mobile device via wired and/or wireless communication channel(s).

In accordance with one or more techniques of this disclosure, the mobile device may be used to acquire a soundfield. For instance, the mobile device may acquire a soundfield via the wired and/or wireless acquisition devices and/or the on-device surround sound capture (e.g., a plurality of microphones integrated into the mobile device). The mobile device may then code the acquired soundfield into various representations for playback by one or more of the playback elements. For instance, a user of the mobile device may record (acquire a soundfield of) a live event (e.g., a meeting, a conference, a play, a concert, etc.), and code the recording into various representation, including higher order ambisonic HOA representations.

The mobile device may also utilize one or more of the playback elements to playback the coded soundfield. For instance, the mobile device may decode the coded soundfield and output a signal to one or more of the playback elements that causes the one or more of the playback elements to recreate the soundfield. As one example, the mobile device may utilize the wireless and/or wireless communication channels to output the signal to one or more speakers (e.g., speaker arrays, sound bars, etc.). As another example, the mobile device may utilize docking solutions to output the signal to one or more docking stations and/or one or more docked speakers (e.g., sound systems in smart cars and/or homes). As another example, the mobile device may utilize headphone rendering to output the signal to a headset or headphones, e.g., to create realistic binaural sound.

In some examples, a particular mobile device may both acquire a soundfield and playback the same soundfield at a later time. In some examples, the mobile device may acquire a soundfield, encode the soundfield, and transmit the encoded soundfield to one or more other devices (e.g., other mobile devices and/or other non-mobile devices) for playback.

Yet another context in which the techniques may be performed includes an audio ecosystem that may include audio content, game studios, coded audio content, rendering engines, and delivery systems. In some examples, the game studios may include one or more DAWs which may support editing of audio signals. For instance, the one or more DAWs may include audio plugins and/or tools which may be configured to operate with (e.g., work with) one or more game audio systems. In some examples, the game studios may output new stem formats that support audio format. In any case, the game studios may output coded audio content to the rendering engines which may render a soundfield for playback by the delivery systems.

The mobile device may also, in some instances, include a plurality of microphones that are collectively configured to record a soundfield, including 3D soundfields. In other words, the plurality of microphone may have X, Y, Z diversity. In some examples, the mobile device may include a microphone which may be rotated to provide X, Y, Z diversity with respect to one or more other microphones of the mobile device.

A ruggedized video capture device may further be configured to record a soundfield. In some examples, the ruggedized video capture device may be attached to a helmet of a user engaged in an activity. For instance, the ruggedized video capture device may be attached to a helmet of a user whitewater rafting. In this way, the ruggedized video capture device may capture a soundfield that represents the action all around the user (e.g., water crashing behind the user, another rafter speaking in front of the user, etc . . . ).

The techniques may also be performed with respect to an accessory enhanced mobile device, which may be configured to record a soundfield, including a 3D soundfield. In some examples, the mobile device may be similar to the mobile devices discussed above, with the addition of one or more accessories. For instance, an microphone, including an Eigen microphone, may be attached to the above noted mobile device to form an accessory enhanced mobile device. In this way, the accessory enhanced mobile device may capture a higher quality version of the soundfield than just using sound capture components integral to the accessory enhanced mobile device.

Example audio playback devices that may perform various aspects of the techniques described in this disclosure are further discussed below. In accordance with one or more techniques of this disclosure, speakers and/or sound bars may be arranged in any arbitrary configuration while still playing back a soundfield, including a 3D soundfield. Moreover, in some examples, headphone playback devices may be coupled to a decoder via either a wired or a wireless connection. In accordance with one or more techniques of this disclosure, a single generic representation of a soundfield may be utilized to render the soundfield on any combination of the speakers, the sound bars, and the headphone playback devices.

A number of different example audio playback environments may also be suitable for performing various aspects of the techniques described in this disclosure. For instance, a 5.1 speaker playback environment, a 2.0 (e.g., stereo) speaker playback environment, a 9.1 speaker playback environment with full height front loudspeakers, a 22.2 speaker playback environment, a 16.0 speaker playback environment, an automotive speaker playback environment, and a mobile device with ear bud playback environment may be suitable environments for performing various aspects of the techniques described in this disclosure.

In accordance with one or more techniques of this disclosure, a single generic representation of a soundfield may be utilized to render the soundfield on any of the foregoing playback environments. Additionally, the techniques of this disclosure enable a rendered to render a soundfield from a generic representation for playback on the playback environments other than that described above. For instance, if design considerations prohibit proper placement of speakers according to a 7.1 speaker playback environment (e.g., if it is not possible to place a right surround speaker), the techniques of this disclosure enable a render to compensate with the other 6 speakers such that playback may be achieved on a 6.1 speaker playback environment.

Moreover, a user may watch a sports game while wearing headphones. In accordance with one or more techniques of this disclosure, the soundfield, including 3D soundfields, of the sports game may be acquired (e.g., one or more microphones and/or Eigen microphones may be placed in and/or around the baseball stadium). HOA coefficients corresponding to the 3D soundfield may be obtained and transmitted to a decoder, the decoder may reconstruct the 3D soundfield based on the HOA coefficients and output the reconstructed 3D soundfield to a renderer, the renderer may obtain an indication as to the type of playback environment (e.g., headphones), and render the reconstructed 3D soundfield into signals that cause the headphones to output a representation of the 3D soundfield of the sports game.

In each of the various instances described above, it should be understood that the source device 12 may perform a method or otherwise comprise means to perform each step of the method for which the source device 12 is described above as performing. In some instances, the means may comprise one or more processors. In some instances, the one or more processors may represent a special purpose processor configured by way of instructions stored to a non-transitory computer-readable storage medium. In other words, various aspects of the techniques in each of the sets of encoding examples may provide for a non-transitory computer-readable storage medium having stored thereon instructions that, when executed, cause the one or more processors to perform the method for which the source device 12 has been configured to perform.

In one or more examples, the functions described may be implemented in hardware, software, firmware, or any combination thereof. If implemented in software, the functions may be stored on or transmitted over as one or more instructions or code on a computer-readable medium and executed by a hardware-based processing unit. Computer-readable media may include computer-readable storage media, which corresponds to a tangible medium such as data storage media. Data storage media may be any available media that can be accessed by one or more computers or one or more processors to retrieve instructions, code and/or data structures for implementation of the techniques described in this disclosure. A computer program product may include a computer-readable medium.

Likewise, in each of the various instances described above, it should be understood that the sink device 14 may perform a method or otherwise comprise means to perform each step of the method for which the sink device 14 is configured to perform. In some instances, the means may comprise one or more processors. In some instances, the one or more processors may represent a special purpose processor configured by way of instructions stored to a non-transitory computer-readable storage medium. In other words, various aspects of the techniques in each of the sets of encoding examples may provide for a non-transitory computer-readable storage medium having stored thereon instructions that, when executed, cause the one or more processors to perform the method for which the sink device 14 has been configured to perform.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. It should be understood, however, that computer-readable storage media and data storage media do not include connections, carrier waves, signals, or other transitory media, but are instead directed to non-transitory, tangible storage media. Disk and disc, as used herein, includes compact disc (CD), laser disc, optical disc, digital versatile disc (DVD), floppy disk and Blu-ray disc, where disks usually reproduce data magnetically, while discs reproduce data optically with lasers. Combinations of the above should also be included within the scope of computer-readable media.

Instructions may be executed by one or more processors, such as one or more digital signal processors (DSPs), general purpose microprocessors, application specific integrated circuits (ASICs), field programmable logic arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules configured for encoding and decoding, or incorporated in a combined codec. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a codec hardware unit or provided by a collection of interoperative hardware units, including one or more processors as described above, in conjunction with suitable software and/or firmware.

In this respect, various aspects of the techniques may enable the following devices, methods, and computer-readable medium to operate as set forth in the following clauses.

Clause 1A. A source device configured to process audio data, the source device comprising: a memory configured to store at least a portion of the audio data; and one or more processors coupled to the memory, and configured to: obtain, from a compressed version of the audio data, a symbol of a plurality of symbols; obtain a plurality of intervals, each of the intervals having a same bit length; obtain a portion of the symbol within the bit length and an excess portion of the symbol over the bit length; specify, in a first interval of the plurality of intervals, the portion of the symbol; specify, in a second interval of the plurality of intervals, the excess portion of the symbol; apply, to the first interval and the second interval, error resiliency to obtain a first error resilient interval and a second error resilient interval; and specify, in a bitstream representative of the compressed version of the audio data, the first error resilient interval and the second error resilient interval.

Clause 2A. The source device of clause 1A, wherein the compressed version of the audio data comprises an entropy coded version of the audio data.

Clause 3A. The source device of clause 2A, wherein the entropy coded version of the audio data comprises a Huffman coded version of the audio data.

Clause 4A. The source device of clause 1A, wherein the one or more processors are further configured to perform entropy coding with respect to the audio data to obtain the compressed version of the audio data.

Clause 5A. The source device of clause 4A, wherein the one or more processors are configured to perform Huffman coding with respect to the audio data to obtain the compressed version of the audio data.

Clause 6A. The source device of any combination of clauses 4A and 5A, wherein the one or more processors are further configured to perform, prior to performing the entropy coding, adaptive differential pulse code modulation (ADPCM) coding with respect to the audio data to obtain the compressed version of the audio data.

Clause 7A. The source device of clause 1A, wherein the one or more processors are further configured to: apply a filter with respect to the audio data to obtain a plurality of filtered portions of the audio data; and perform entropy coding with respect to the plurality of portions of the audio data to obtain entropy coded versions of the plurality of portions, each of the entropy coded version of the plurality of portions comprising one or more codewords, and wherein the symbol comprises a codeword from the one or more codewords of two or more of the entropy coded versions of the plurality of filtered portions.

Clause 8A. The source device of clause 7A, wherein the filter comprises a subband filter, and wherein the plurality of filtered portions comprises a plurality of subbands.

Clause 9A. The source device of any combination of clauses 7A and 8A, wherein the one or more processors are further configured to obtain a subset of the plurality of portions to which the error resiliency is to be applied, and wherein the one or more processors are configured to obtain, from the subset of the plurality of portions, the plurality of symbols.

Clause 10A. The source device of clause 9A, wherein the plurality of symbols comprises a sequential ordering of the codewords from the two or more of the entropy coded versions of the plurality of filtered portions.

Clause 11A. The source device of any combination of clauses 1A-10A, further comprising a transceiver configured to transmit the bitstream to a sink device in accordance with a wireless communication protocol.

Clause 12A. The source device of clause 11A, wherein the wireless communication protocol comprises a personal area network wireless communication protocol.

Clause 13A. The source device of clause 11A, wherein the personal area network wireless communication protocol comprises a Bluetooth® wireless communication protocol.

Clause 14A. The source device of clause 11A, wherein the personal area network wireless communication protocol comprises a Bluetooth® wireless communication protocol operating according to the advance audio distribution profile.

Clause 15A. The source device of any combination of clauses 1A-14A, wherein the one or more processors are configured to apply majority voting error detection with respect to the first interval and the second interval to obtain the first error resilient interval and the second error resilient interval.

Clause 16A. A method of processing audio data, the method comprising: obtaining, from a compressed version of the audio data, a symbol of a plurality of symbols; obtaining a plurality of intervals, each of the intervals having a same bit length; obtaining a portion of the symbol within the bit length and an excess portion of the symbol over the bit length; specifying, in a first interval of the plurality of intervals, the portion of the symbol; specifying, in a second interval of the plurality of intervals, the excess portion of the symbol; applying, to the first interval and the second interval, error resiliency to obtain a first error resilient interval and a second error resilient interval; and specifying, in a bitstream representative of the compressed version of the audio data, the first error resilient interval and the second error resilient interval.

Clause 17A. The method of clause 16A, wherein the compressed version of the audio data comprises an entropy coded version of the audio data.

Clause 18A. The method of clause 17A, wherein the entropy coded version of the audio data comprises a Huffman coded version of the audio data.

Clause 19A. The method of clause 16A, further comprising performing entropy coding with respect to the audio data to obtain the compressed version of the audio data.

Clause 20A. The method of clause 19A, wherein performing the entropy coding comprises performing Huffman coding with respect to the audio data to obtain the compressed version of the audio data.

Clause 21A. The method of any combination of clauses 19A and 20A, further comprising performing, prior to performing the entropy coding, adaptive differential pulse code modulation (ADPCM) coding with respect to the audio data to obtain the compressed version of the audio data.

Clause 22A. The method of clause 16A, further comprising: applying a filter with respect to the audio data to obtain a plurality of filtered portions of the audio data; and performing entropy coding with respect to the plurality of portions of the audio data to obtain entropy coded versions of the plurality of portions, each of the entropy coded version of the plurality of portions comprising one or more codewords, wherein the symbol comprises a codeword from the one or more codewords of two or more of the entropy coded versions of the plurality of filtered portions.

Clause 23A. The method of clause 22A, wherein the filter comprises a subband filter, and wherein the plurality of filtered portions comprises a plurality of subbands.

Clause 24A. The method of any combination of clauses 22A and 23A, further comprising obtaining a subset of the plurality of portions to which the error resiliency is to be applied, and wherein obtaining the symbol comprises obtaining, from the subset of the plurality of portions, the plurality of symbols.

Clause 25A. The method of clause 24A, wherein the plurality of symbols comprises a sequential ordering of the codewords from the two or more of the entropy coded versions of the plurality of filtered portions.

Clause 26A. The method of any combination of clauses 16A-25A, further comprising transmitting the bitstream to a sink device in accordance with a wireless communication protocol.

Clause 27A. The method of clause 26A, wherein the wireless communication protocol comprises a personal area network wireless communication protocol.

Clause 28A. The method of clause 26A, wherein the personal area network wireless communication protocol comprises a Bluetooth® wireless communication protocol.

Clause 29A. The method of clause 26A, wherein the personal area network wireless communication protocol comprises a Bluetooth® wireless communication protocol operating according to the advance audio distribution profile.

Clause 30A. The method of any combination of clauses 16A-29A, wherein performing the error resiliency comprises performing majority voting error detection with respect to the first interval and the second interval to obtain the first error resilient interval and the second error resilient interval.

Clause 31A. A source device configured to process audio data, the source device comprising: means for obtaining, from a compressed version of the audio data, a symbol of a plurality of symbols; means for obtaining a plurality of intervals, each of the intervals having a same bit length; means for obtaining a portion of the symbol within the bit length and an excess portion of the symbol over the bit length; means for specifying, in a first interval of the plurality of intervals, the portion of the symbol; means for specifying, in a second interval of the plurality of intervals, the excess portion of the symbol; means for applying, to the first interval and the second interval, error resiliency to obtain a first error resilient interval and a second error resilient interval; and means for specifying, in a bitstream representative of the compressed version of the audio data, the first error resilient interval and the second error resilient interval.

Clause 32A. The source device of clause 31, wherein the compressed version of the audio data comprises an entropy coded version of the audio data.

Clause 33A. The source device of clause 32A, wherein the entropy coded version of the audio data comprises a Huffman coded version of the audio data.

Clause 34A. The source device of clause 31A, further comprising means for performing entropy coding with respect to the audio data to obtain the compressed version of the audio data.

Clause 35A. The source device of clause 34A, wherein the means for performing the entropy coding comprises means for performing Huffman coding with respect to the audio data to obtain the compressed version of the audio data.

Clause 36A. The source device of any combination of clauses 34A and 35A, further comprising means for performing, prior to performing the entropy coding, adaptive differential pulse code modulation (ADPCM) coding with respect to the audio data to obtain the compressed version of the audio data.

Clause 37A. The source device of clause 31A, further comprising: means for applying a filter with respect to the audio data to obtain a plurality of filtered portions of the audio data; and means for performing entropy coding with respect to the plurality of portions of the audio data to obtain entropy coded versions of the plurality of portions, each of the entropy coded version of the plurality of portions comprising one or more codewords, wherein the symbol comprises a codeword from the one or more codewords of two or more of the entropy coded versions of the plurality of filtered portions.

Clause 38A. The source device of clause 37A, wherein the filter comprises a subband filter, and wherein the plurality of filtered portions comprises a plurality of subbands.

Clause 39A. The source device of any combination of clauses 37A and 38A, further comprising means for obtaining a subset of the plurality of portions to which the error resiliency is to be applied, and wherein the means for obtaining the symbol comprises means for obtaining, from the subset of the plurality of portions, the plurality of symbols.

Clause 40A. The source device of clause 39A, wherein the plurality of symbols comprises a sequential ordering of the codewords from the two or more of the entropy coded versions of the plurality of filtered portions.

Clause 41A. The source device of any combination of clauses 31A-40A, further comprising means for transmitting the bitstream to a sink device in accordance with a wireless communication protocol.

Clause 42A. The source device of clause 41A, wherein the wireless communication protocol comprises a personal area network wireless communication protocol.

Clause 43A. The source device of clause 41A, wherein the personal area network wireless communication protocol comprises a Bluetooth® wireless communication protocol.

Clause 44A. The source device of clause 41A, wherein the personal area network wireless communication protocol comprises a Bluetooth® wireless communication protocol operating according to the advance audio distribution profile.

Clause 45A. The source device of any combination of clauses 31A-44A, wherein the means for performing the error resiliency comprises means for performing majority voting error detection with respect to the first interval and the second interval to obtain the first error resilient interval and the second error resilient interval.

Clause 46A. A computer-readable medium having stored thereon instructions that, when executed, cause one or more processors of a source device to: obtain, from a compressed version of audio data, a symbol of a plurality of symbols; obtain a plurality of intervals, each of the intervals having a same bit length; obtain a portion of the symbol within the bit length and an excess portion of the symbol over the bit length; specify, in a first interval of the plurality of intervals, the portion of the symbol; specify, in a second interval of the plurality of intervals, the excess portion of the symbol; apply, to the first interval and the second interval, error resiliency to obtain a first error resilient interval and a second error resilient interval; and specify, in a bitstream representative of the compressed version of the audio data, the first error resilient interval and the second error resilient interval.

Clause 1B. A sink device configured to process a bitstream representative of a compressed version of audio data, the sink device comprising: a memory configured to store at least a portion of the bitstream; and one or more processors coupled to the memory, and configured to: obtain, from the bitstream, a first error resilient interval and a second error resilient interval, each of the first error resilient interval and the second error resilient interval having a same bit length; perform error detection with respect to the first error resilient interval and the second error resilient interval to detect a presence of one or more errors in one or more of the first error resilient interval and the second error resilient interval; responsive to detecting that the one or more errors were not present in the first error resilient interval and the second error resilient interval; obtain, from the first error resilient interval, a portion of a symbol within the bit length, the symbol indicative of the compressed version of the audio data; obtain, from the second error resilient interval, an excess portion of the symbol over the bit length; and decompress, based on the portion and the excess portion, the symbol to obtain a portion of the audio data.

Clause 1.5B. The sink device of clause 1B, wherein the symbol comprises a first symbol, wherein the second error resilient interval includes a second symbol, and wherein the one or more processors are configured to: push, when obtaining the second symbol from the second error resilient interval, the excess portion onto a stack; and obtain, responsive to determining that the portion of the symbol is incomplete and from the stack, the excess portion.

Clause 2B. The sink device of clause 1B, wherein the one or more processors are further configured to, responsive to detecting that the one or more errors were present in the first interval: decompress, based on the portion of the symbol, one or more codewords of the portion of the symbols occurring before the detected one or more errors in the first interval to obtain a partial portion of the audio data; and discard the excess portion.

Clause 3B. The sink device of clause 1B, wherein the one or more processors are further configured to, responsive to detecting that the one or more errors were present in the second interval but not the first interval: discard the excess portion; and decompress, based on the portion of the symbol, one or more codewords of the portion of the symbol occurring before the detected error in the first interval to obtain a partial portion of the audio data.

Clause 4B. The sink device of any combination of clauses 1B-3B, wherein the one or more processors are further configured to systematically store the second error resilient interval in a stack directly above the first error resilient interval.

Clause 5B. The sink device of any combination of clauses 1B-3B, wherein the symbol comprises a first symbol, wherein the portion of the audio data comprises a first portion of the audio data, wherein the one or more processors are further configured to obtain, from the second interval, a second symbol, the second symbol having a length less than or equal to the bit length minus a length of the excess portion, and wherein the one or more processors are further configured to, responsive to detecting that the one or more errors were not present in the second error resilient interval decompress the second symbol to obtain a second portion of the audio data.

Clause 6B. The sink device of any combination of clauses 1B-3B, wherein the symbol comprises a first symbol, wherein the portion of the audio data comprises a first portion of the audio data, wherein the one or more processors are further configured to: obtain, from the bitstream, a third interval including a second symbol, the third interval having the same bit length as the first interval, the second symbol having a length equal to or exceeding the bit length, and wherein the one or more processors are further configured to, responsive to detecting that the one or more errors were not present in the second error resilient interval, decompress the second symbol to obtain a second portion of the audio data.

Clause 7B. The sink device of clause 6B, wherein the one or more processors are further configured to: systematically store the third interval in a stack directly above the first error resilient interval; and systematically store the second error resilient interval in a stack directly above the third interval.

Clause 8B. The sink device of any combination of clauses 1B-7B, wherein the compressed version of the audio data comprises an entropy coded version of the audio data.

Clause 9B. The sink device of clause 8B, wherein the entropy coded version of the audio data comprises a Huffman coded version of the audio data.

Clause 10B. The sink device of any combination of clauses 1B-7B, wherein the one or more processors are configured to perform entropy decoding with respect to the symbol to obtain the portion of the audio data.

Clause 11B. The sink device of clause 10B, wherein the one or more processors are configured to perform Huffman decoding with respect to the symbol to obtain the portion of the audio data.

Clause 12B. The sink device of clause 1B, wherein the symbol comprises two or more codewords, each of the two or more codewords representative of different entropy coded filtered portions of the audio data, and wherein the one or more processors are configured to perform entropy decoding with respect to the two or more codewords to obtain different filtered portions of the audio data.

Clause 13B. The sink device of clause 12B, wherein the different filtered portions each comprises a different subband.

Clause 14B. The sink device of clause 1B, further comprising a transceiver configured to receive the bitstream via a wireless connection in accordance with a wireless communication protocol.

Clause 15B. The sink device of clause 14B, wherein the wireless communication protocol comprises a personal area network wireless communication protocol.

Clause 16B. The sink device of clause 15B, wherein the personal area network wireless communication protocol comprises a Bluetooth® wireless communication protocol.

Clause 17B. The sink device of clause 15B, wherein the personal area network wireless communication protocol comprises a Bluetooth® wireless communication protocol operating according to the advance audio distribution profile.

Clause 18B. The sink device of any combination of clauses 1B-17B, wherein the one or more processors are configured to apply majority voting error detection with respect to the first error resilient interval and the second error resilient interval to detect the presence of the one or more errors in the one or more of the first error resilient interval and the second error resilient interval.

Clause 19B. A method of processing a bitstream representative of audio data, the method comprising: obtaining, from the bitstream, a first error resilient interval and a second error resilient interval, each of the first error resilient interval and the second error resilient interval having a same bit length; performing error detection with respect to the first error resilient interval and the second error resilient interval to detect a presence of one or more errors in one or more of the first error resilient interval and the second error resilient interval; responsive to detecting that the one or more errors were not present in the first error resilient interval and the second error resilient interval: obtaining, from the first error resilient interval, a portion of a symbol within the bit length, the symbol indicative of the compressed version of the audio data, and; obtaining, from the second error resilient interval, an excess portion of the symbol over the bit length; and decompressing, based on the portion and the excess portion, the symbol to obtain a portion of the audio data.

Clause 19.5B. The method of clause 19B, wherein the symbol comprises a first symbol, wherein the second error resilient interval includes a second symbol, and wherein obtaining the excess portion comprises: pushing, when obtaining the second symbol from the second error resilient interval, the excess portion onto a stack; and obtaining, responsive to determining that the portion of the symbol is incomplete and from the stack, the excess portion.

Clause 20B. The method of clause 19B, further comprising, responsive to detecting that the one or more errors were present in the first interval: decompressing, based on the portion of the symbol, one or more codewords of the portion of the symbols occurring before the detected one or more errors in the first interval to obtain a partial portion of the audio data; and discarding the excess portion.

Claus 21B. The method of clause 19B, further comprising, responsive to detecting that the one or more errors were present in the second interval but not the first interval: discarding the excess portion; and decompressing, based on the portion of the symbol, one or more codewords of the portion of the symbol occurring before the detected error in the first interval to obtain a partial portion of the audio data.

Clause 22B. The method of any combination of clauses 19B-21B, further comprising systematically storing the second error resilient interval in a stack directly above the first error resilient interval.

Clause 23B. The method of any combination of clauses 19B-21B, wherein the symbol comprises a first symbol, wherein the portion of the audio data comprises a first portion of the audio data, and wherein the method further comprises: obtaining, from the second interval, a second symbol, the second symbol having a length less than or equal to the bit length minus a length of the excess portion; and decompressing, responsive to detecting that the one or more errors were not present in the second error resilient interval, the second symbol to obtain a second portion of the audio data.

Clause 24B. The method of any combination of clauses 19B-21B, wherein the symbol comprises a first symbol, wherein the portion of the audio data comprises a first portion of the audio data, and wherein the method further comprises: obtaining, from the bitstream, a third interval including a second symbol, the third interval having the same bit length as the first interval, the second symbol having a length equal to or exceeding the bit length, and decompressing, responsive to detecting that the one or more errors were not present in the second error resilient interval, the second symbol to obtain a second portion of the audio data.

Clause 25B. The method of clause 24B, further comprising: systematically storing the third interval in a stack directly above the first error resilient interval; and systematically storing the second error resilient interval in a stack directly above the third interval.

Clause 26B. The method of any combination of clauses 19B-25B, wherein the compressed version of the audio data comprises an entropy coded version of the audio data.

Clause 27B. The method of clause 26B, wherein the entropy coded version of the audio data comprises a Huffman coded version of the audio data.

Clause 28B. The method of any combination of clauses 19B-25B, wherein decompressing the symbol comprises performing entropy decoding with respect to the symbol to obtain the portion of the audio data.

Clause 29B. The method of clause 28B, wherein performing entropy decoding comprises performing Huffman decoding with respect to the symbol to obtain the portion of the audio data.

Clause 30B. The method of clause 19B, wherein the symbol comprises two or more codewords, each of the two or more codewords representative of different entropy coded filtered portions of the audio data, and wherein decompressing the symbol comprises performing entropy decoding with respect to the two or more codewords to obtain different filtered portions of the audio data.

Clause 31B. The method of clause 30B, wherein the different filtered portions each comprises a different subband.

Clause 32B. The method of clause 19B, further comprising receiving the bitstream via a wireless connection in accordance with a wireless communication protocol.

Clause 33B. The method of clause 32B, wherein the wireless communication protocol comprises a personal area network wireless communication protocol.

Clause 34B. The method of clause 33B, wherein the personal area network wireless communication protocol comprises a Bluetooth® wireless communication protocol.

Clause 35B. The method of clause 33B, wherein the personal area network wireless communication protocol comprises a Bluetooth® wireless communication protocol operating according to the advance audio distribution profile.

Clause 36B. The method of any combination of clauses 19B-35B, wherein performing error detection comprises performing majority voting error detection with respect to the first error resilient interval and the second error resilient interval to detect the presence of the one or more errors in the one or more of the first error resilient interval and the second error resilient interval.

Clause 37B. A sink device configured to process a bitstream representative of audio data, the sink device comprising: means for obtaining, from the bitstream, a first error resilient interval and a second error resilient interval, each of the first error resilient interval and the second error resilient interval having a same bit length; means for performing error detection with respect to the first error resilient interval and the second error resilient interval to detect a presence of one or more errors in one or more of the first error resilient interval and the second error resilient interval; responsive to detecting that the one or more errors were not present in the first error resilient interval and the second error resilient interval: means for obtaining, from the first error resilient interval, a portion of a symbol within the bit length, the symbol indicative of the compressed version of the audio data, and; means for obtaining, from the second error resilient interval, an excess portion of the symbol over the bit length; and means for decompressing, based on the portion and the excess portion, the symbol to obtain a portion of the audio data.

Clause 37.5B. The sink device of clause 37B, wherein the symbol comprises a first symbol, wherein the second error resilient interval includes a second symbol, and wherein obtaining the excess portion comprises: means for pushing, when obtaining the second symbol from the second error resilient interval, the excess portion onto a stack; and means for obtaining, responsive to determining that the portion of the symbol is incomplete and from the stack, the excess portion.

Clause 38B. The sink device of clause 37B, further comprising, responsive to detecting that the one or more errors were present in the first interval: means for decompressing, based on the portion of the symbol, one or more codewords of the portion of the symbols occurring before the detected one or more errors in the first interval to obtain a partial portion of the audio data; and means for discarding the excess portion.

Clause 39B. The sink device of clause 37B, further comprising, responsive to detecting that the one or more errors were present in the second interval but not the first interval: means for discarding the excess portion; and means for decompressing, based on the portion of the symbol, one or more codewords of the portion of the symbol occurring before the detected error in the first interval to obtain a partial portion of the audio data.

Clause 40B. The sink device of any combination of clauses 37B-39B, further comprising means for systematically storing the second error resilient interval in a stack directly above the first error resilient interval.

Clause 41B. The sink device of any combination of clauses 37B-39B, wherein the symbol comprises a first symbol, wherein the portion of the audio data comprises a first portion of the audio data, and wherein the sink device further comprises: means for obtaining, from the second interval, a second symbol, the second symbol having a length less than or equal to the bit length minus a length of the excess portion; and means for decompressing, responsive to detecting that the one or more errors were not present in the second error resilient interval, the second symbol to obtain a second portion of the audio data.

Clause 42B. The sink device of any combination of clauses 37B-39B, wherein the symbol comprises a first symbol, wherein the portion of the audio data comprises a first portion of the audio data, and wherein the sink device further comprises: means for obtaining, from the bitstream, a third interval including a second symbol, the third interval having the same bit length as the first interval, the second symbol having a length equal to or exceeding the bit length, and means for decompressing, responsive to detecting that the one or more errors were not present in the second error resilient interval, the second symbol to obtain a second portion of the audio data.

Clause 43B. The sink device of clause 42B, further comprising: means for systematically storing the third interval in a stack directly above the first error resilient interval; and means for systematically storing the second error resilient interval in a stack directly above the third interval.

Clause 44B. The sink device of any combination of clauses 37B-43B, wherein the compressed version of the audio data comprises an entropy coded version of the audio data.

Clause 45B. The sink device of clause 44B, wherein the entropy coded version of the audio data comprises a Huffman coded version of the audio data.

Clause 46B. The sink device of any combination of clauses 37B-43B, wherein the means for decompressing the symbol comprises means for performing entropy decoding with respect to the symbol to obtain the portion of the audio data.

Clause 47B. The sink device of clause 46B, wherein the means for performing entropy decoding comprises means for performing Huffman decoding with respect to the symbol to obtain the portion of the audio data.

Clause 48B. The sink device of clause 37B, wherein the symbol comprises two or more codewords, each of the two or more codewords representative of different entropy coded filtered portions of the audio data, and wherein the means for decompressing the symbol comprises means for performing entropy decoding with respect to the two or more codewords to obtain different filtered portions of the audio data.

Clause 49B. The sink device of clause 48B, wherein the different filtered portions each comprises a different subband.

Clause 50B. The sink device of clause 37B, further comprising means for receiving the bitstream via a wireless connection in accordance with a wireless communication protocol.

Clause 51B. The sink device of clause 50B, wherein the wireless communication protocol comprises a personal area network wireless communication protocol.

Clause 52B. The sink device of clause 51B, wherein the personal area network wireless communication protocol comprises a Bluetooth® wireless communication protocol.

Clause 53B. The sink device of clause 51B, wherein the personal area network wireless communication protocol comprises a Bluetooth® wireless communication protocol operating according to the advance audio distribution profile.

Clause 54B. The sink device of any combination of clauses 37B-53B, wherein the means for performing error detection comprises means for performing majority voting error detection with respect to the first error resilient interval and the second error resilient interval to detect the presence of the one or more errors in the one or more of the first error resilient interval and the second error resilient interval.

Clause 55B. A non-transitory computer-readable storage medium having stored thereon instructions that, when executed, cause one or more processors of a sink device to: obtain, from a bitstream representative of audio data, a first error resilient interval and a second error resilient interval, each of the first error resilient interval and the second error resilient interval having a same bit length; perform error detection with respect to the first error resilient interval and the second error resilient interval to detect a presence of one or more errors in one or more of the first error resilient interval and the second error resilient interval; responsive to detecting that the one or more errors were not present in the first error resilient interval and the second error resilient interval: obtain, from the first error resilient interval, a portion of a symbol within the bit length, the symbol indicative of the compressed version of the audio data, and; obtain, from the second error resilient interval, an excess portion of the symbol over the bit length; and decompress, based on the portion and the excess portion, the symbol to obtain a portion of the audio data.

Various aspects of the techniques have been described. These and other aspects of the techniques are within the scope of the following claims.

The invention claimed is:

1. A source device configured to process audio data, the source device comprising:
   a memory configured to store at least a portion of the audio data; and
   one or more processors coupled to the memory, and configured to:
   obtain, from a compressed version of the audio data, a symbol of a plurality of symbols;
   obtain a plurality of intervals, each of the intervals having a same bit length;
   obtain a portion of the symbol within the bit length and an excess portion of the symbol over the bit length;
   specify, in a first interval of the plurality of intervals, the portion of the symbol;
   specify, in a second interval of the plurality of intervals, the excess portion of the symbol;
   apply, to the first interval and the second interval, error resiliency to obtain a first error resilient interval and a second error resilient interval; and
   specify, in a bitstream representative of the compressed version of the audio data, the first error resilient interval and the second error resilient interval.

2. The source device of claim 1, wherein the compressed version of the audio data comprises an entropy coded version of the audio data.

3. The source device of claim 2, wherein the entropy coded version of the audio data comprises a Huffman coded version of the audio data.

4. The source device of claim 1, wherein the one or more processors are further configured to perform entropy coding with respect to the audio data to obtain the compressed version of the audio data.

5. The source device of claim 4, wherein the one or more processors are configured to perform Huffman coding with respect to the audio data to obtain the compressed version of the audio data.

6. The source device of claim 4, wherein the one or more processors are further configured to perform, prior to performing the entropy coding, adaptive differential pulse code modulation (ADPCM) coding with respect to the audio data to obtain the compressed version of the audio data.

7. The source device of claim 1,
   wherein the one or more processors are further configured to:
   apply a filter with respect to the audio data to obtain a plurality of filtered portions of the audio data; and
   perform entropy coding with respect to the plurality of portions of the audio data to obtain entropy coded versions of the plurality of portions, each of the entropy coded version of the plurality of portions comprising one or more codewords, and
   wherein the symbol comprises a codeword from the one or more codewords of two or more of the entropy coded versions of the plurality of filtered portions.

8. The source device of claim 7,
   wherein the filter comprises a subband filter, and
   wherein the plurality of filtered portions comprises a plurality of subbands.

9. The source device of claim 7,
   wherein the one or more processors are further configured to obtain a subset of the plurality of portions to which the error resiliency is to be applied, and
   wherein the one or more processors are configured to obtain, from the subset of the plurality of portions, the plurality of symbols.

10. The source device of claim 9, wherein the plurality of symbols comprises a sequential ordering of the codewords from the two or more of the entropy coded versions of the plurality of filtered portions.

11. The source device of claim 1, further comprising a transceiver configured to transmit the bitstream to a sink device in accordance with a wireless communication protocol, wherein the wireless communication protocol comprises one of a personal area network wireless communication protocol, a Bluetooth® wireless communication protocol, or a Bluetooth® wireless communication protocol operating according to the advance audio distribution profile.

12. The source device of claims 1, wherein the one or more processors are configured to apply majority voting error detection with respect to the first interval and the second interval to obtain the first error resilient interval and the second error resilient interval.

13. A method of processing audio data, the method comprising:
   obtaining, from a compressed version of the audio data, a symbol of a plurality of symbols;

obtaining a plurality of intervals, each of the intervals having a same bit length;
obtaining a portion of the symbol within the bit length and an excess portion of the symbol over the bit length;
specifying, in a first interval of the plurality of intervals, the portion of the symbol;
specifying, in a second interval of the plurality of intervals, the excess portion of the symbol;
applying, to the first interval and the second interval, error resiliency to obtain a first error resilient interval and a second error resilient interval; and
specifying, in a bitstream representative of the compressed version of the audio data, the first error resilient interval and the second error resilient interval.

14. A sink device configured to process a bitstream representative of a compressed version of audio data, the sink device comprising:
a memory configured to store at least a portion of the bitstream; and
one or more processors coupled to the memory, and configured to:
obtain, from the bitstream, a first error resilient interval and a second error resilient interval, each of the first error resilient interval and the second error resilient interval having a same bit length;
perform error detection with respect to the first error resilient interval and the second error resilient interval to detect a presence of one or more errors in one or more of the first error resilient interval and the second error resilient interval;
responsive to detecting that the one or more errors were not present in the first error resilient interval and the second error resilient interval:
obtain, from the first error resilient interval, a portion of a symbol within the bit length, the symbol indicative of the compressed version of the audio data, and;
obtain, from the second error resilient interval, an excess portion of the symbol over the bit length; and
decompress, based on the portion and the excess portion, the symbol to obtain a portion of the audio data.

15. The sink device of claim 14,
wherein the symbol comprises a first symbol,
wherein the second error resilient interval includes a second symbol, and
wherein the one or more processors are configured to:
push, when obtaining the second symbol from the second error resilient interval, the excess portion onto a stack; and
obtain, responsive to determining that the portion of the symbol is incomplete and from the stack, the excess portion.

16. The sink device of claim 14, wherein the one or more processors are further configured to, responsive to detecting that the one or more errors were present in the first interval:
decompress, based on the portion of the symbol, one or more codewords of the portion of the symbols occurring before the detected one or more errors in the first interval to obtain a partial portion of the audio data;
discard the excess portion.

17. The sink device of claim 14, wherein the one or more processors are further configured to, responsive to detecting that the one or more errors were present in the second interval but not the first interval:
discard the excess portion; and
decompress, based on the portion of the symbol, one or more codewords of the portion of the symbol occurring before the detected error in the first interval to obtain a partial portion of the audio data.

18. The sink device of claim 14, wherein the one or more processors are further configured to systematically store the second error resilient interval in a stack directly above the first error resilient interval.

19. The sink device of claim 14,
wherein the symbol comprises a first symbol,
wherein the portion of the audio data comprises a first portion of the audio data,
wherein the one or more processors are further configured to obtain, from the second interval, a second symbol, the second symbol having a length less than or equal to the bit length minus a length of the excess portion, and
wherein the one or more processors are further configured to, responsive to detecting that the one or more errors were not present in the second error resilient interval:
decompress the second symbol to obtain a second portion of the audio data.

20. The sink device of claim 14,
wherein the symbol comprises a first symbol,
wherein the portion of the audio data comprises a first portion of the audio data,
wherein the one or more processors are further configured to:
obtain, from the bitstream, a third interval including a second symbol, the third interval having the same bit length as the first interval, the second symbol having a length equal to or exceeding the bit length, and
wherein the one or more processors are further configured to, responsive to detecting that the one or more errors were not present in the second error resilient interval:
decompress the second symbol to obtain a second portion of the audio data.

21. The sink device of claim 20, wherein the one or more processors are further configured to:
systematically store the third interval in a stack directly above the first error resilient interval; and
systematically store the second error resilient interval in a stack directly above the third interval.

22. The sink device of claim 14, wherein the compressed version of the audio data comprises an entropy coded version of the audio data.

23. The sink device of claim 22, wherein the entropy coded version of the audio data comprises a Huffman coded version of the audio data.

24. The sink device of claim 14, wherein the one or more processors are configured to perform entropy decoding with respect to the symbol to obtain the portion of the audio data.

25. The sink device of claim 24, wherein the one or more processors are configured to perform Huffman decoding with respect to the symbol to obtain the portion of the audio data.

26. The sink device of claim 14,
wherein the symbol comprises two or more codewords, each of the two or more codewords representative of different entropy coded filtered portions of the audio data, and
wherein the one or more processors are configured to perform entropy decoding with respect to the two or more codewords to obtain different filtered portions of the audio data.

27. The sink device of claim 26, wherein the different filtered portions each comprises a different subband.

28. The sink device of claim 14, further comprising a transceiver configured to receive the bitstream via a wireless connection in accordance with a wireless communication protocol.

29. The sink device of claim 14, wherein the one or more processors are configured to apply majority voting error detection with respect to the first error resilient interval and the second error resilient interval to detect the presence of the one or more errors in the one or more of the first error resilient interval and the second error resilient interval.

30. A method of processing a bitstream representative of audio data, the method comprising:
- obtaining, from the bitstream, a first error resilient interval and a second error resilient interval, each of the first error resilient interval and the second error resilient interval having a same bit length;
- performing error detection with respect to the first error resilient interval and the second error resilient interval to detect a presence of one or more errors in one or more of the first error resilient interval and the second error resilient interval;
- responsive to detecting that the one or more errors were not present in the first error resilient interval and the second error resilient interval:
  - obtaining, from the first error resilient interval, a portion of a symbol within the bit length, the symbol indicative of the compressed version of the audio data, and;
  - obtaining, from the second error resilient interval, an excess portion of the symbol over the bit length; and decompressing, based on the portion and the excess portion, the symbol to obtain a portion of the audio data.

* * * * *